United States Patent
Yamabe et al.

(10) Patent No.: US 11,521,687 B2
(45) Date of Patent: Dec. 6, 2022

(54) SEMICONDUCTOR MEMORY DEVICE

(71) Applicant: KIOXIA CORPORATION, Tokyo (JP)

(72) Inventors: Kazuharu Yamabe, Yokkaichi Mie (JP); Qianqian Xu, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/315,079

(22) Filed: May 7, 2021

(65) Prior Publication Data

US 2021/0264984 A1 Aug. 26, 2021

Related U.S. Application Data

(63) Continuation of application No. 16/808,187, filed on Mar. 3, 2020, now Pat. No. 11,004,514.

(30) Foreign Application Priority Data

Sep. 17, 2019 (JP) .............................. JP2019-168382

(51) Int. Cl.
| | | |
|---|---|---|
| *G11C 16/04* | (2006.01) | |
| *G11C 16/10* | (2006.01) | |
| *G11C 16/08* | (2006.01) | |
| *G11C 16/26* | (2006.01) | |
| *G11C 11/56* | (2006.01) | |
| *G11C 16/14* | (2006.01) | |

(52) U.S. Cl.
CPC .......... *G11C 16/10* (2013.01); *G11C 16/0483* (2013.01); *G11C 16/08* (2013.01); *G11C 16/26* (2013.01); *G11C 11/5621* (2013.01); *G11C 11/5671* (2013.01); *G11C 16/14* (2013.01)

(58) Field of Classification Search
CPC ..... G11C 16/10; G11C 16/08; G11C 16/0483; G11C 16/26; G11C 16/14; G11C 11/5671; G11C 11/5621
USPC ......................................... 365/185.23, 185.24
See application file for complete search history.

(56) References Cited

U.S. PATENT DOCUMENTS

| | | | |
|---|---|---|---|
| 7,623,387 B2 * | 11/2009 | Dong ................. | G11C 16/3427 365/185.26 |
| 9,786,673 B1 * | 10/2017 | Cho ................... | H01L 27/11565 |
| 9,972,641 B1 * | 5/2018 | Zhang ............... | H01L 21/76224 |
| 10,685,723 B1 | 6/2020 | Chen et al. | |
| 2005/0207220 A1 | 9/2005 | Takeuchi | |

(Continued)

FOREIGN PATENT DOCUMENTS

TW 201839773 A 11/2018

*Primary Examiner* — Michael T Tran
(74) *Attorney, Agent, or Firm* — Kim & Stewart LLP

(57) ABSTRACT

A memory device includes a first cell above a substrate, a first line connected to the first cell, a second cell above the first cell connected with the first cell, a second line connected to the second cell, a third cell above the second cell connected with the second cell, a third line connected to the third cell, a fourth cell above the third cell connected with the third cell, a fourth line connected to the fourth cell, and a driver applying voltages to the lines when data is written to a cell in a write operation. To write data to the second cell, the driver applies a write voltage to the second line, applies a first voltage lower than the write voltage to the first line, and applies a second voltage higher than the first voltage and lower than the write voltage to the third and fourth lines.

19 Claims, 23 Drawing Sheets

(56) References Cited

U.S. PATENT DOCUMENTS

| | | |
|---|---|---|
| 2008/0130360 A1 | 6/2008 | Kim |
| 2008/0186776 A1 | 8/2008 | Kim et al. |
| 2008/0266973 A1* | 10/2008 | Sekar .................. G11C 8/08 |
| | | 365/185.21 |
| 2009/0282184 A1* | 11/2009 | Dutta .................. B05B 11/3098 |
| | | 711/E12.002 |
| 2010/0002522 A1 | 1/2010 | Park |
| 2010/0165733 A1 | 7/2010 | Nakamura et al. |
| 2011/0149659 A1 | 6/2011 | Goda et al. |
| 2012/0300550 A1 | 11/2012 | Hemink et al. |
| 2016/0093390 A1 | 3/2016 | Yuan et al. |
| 2016/0260483 A1 | 9/2016 | Shano et al. |
| 2017/0011795 A1 | 1/2017 | Kifune et al. |
| 2018/0074896 A1 | 3/2018 | Takada et al. |
| 2018/0190498 A1 | 7/2018 | Lee |
| 2018/0261614 A1* | 9/2018 | Kobayashi ........ H01L 27/11582 |
| 2018/0315479 A1* | 11/2018 | Lee .................. G11C 16/30 |
| 2019/0057975 A1* | 2/2019 | Kim .................. H01L 27/11556 |
| 2019/0081066 A1* | 3/2019 | Choi .................. H01L 27/11582 |
| 2019/0088587 A1* | 3/2019 | Takekida ............ H01L 27/1157 |
| 2019/0147961 A1* | 5/2019 | Lee .................. G11C 8/08 |
| | | 365/185.05 |
| 2019/0156897 A1* | 5/2019 | Lee .................. G11C 16/32 |
| 2019/0180798 A1 | 6/2019 | Ahmed et al. |
| 2019/0198523 A1* | 6/2019 | Nakanishi ......... H01L 27/11565 |
| 2019/0221575 A1* | 7/2019 | Dong .................. H01L 29/2003 |
| 2019/0287618 A1 | 9/2019 | Kimura et al. |
| 2019/0287988 A1* | 9/2019 | Takekida .......... H01L 27/11519 |
| 2019/0287996 A1 | 9/2019 | Suzuki et al. |
| 2019/0288033 A1* | 9/2019 | Sukekawa ............ H01F 10/329 |
| 2019/0295626 A1* | 9/2019 | Ikeda .................. G11C 11/4094 |
| 2019/0296079 A1* | 9/2019 | Murakami ........ H01L 27/11582 |
| 2019/0296234 A1* | 9/2019 | Yoshimura ......... G11C 13/0026 |
| 2019/0319033 A1* | 10/2019 | Lee .................... H01L 27/1157 |
| 2019/0371395 A1 | 12/2019 | Lin et al. |
| 2020/0126991 A1 | 4/2020 | Yamazaki et al. |
| 2020/0144308 A1 | 5/2020 | Yakubo et al. |
| 2020/0152282 A1 | 5/2020 | Yang et al. |

\* cited by examiner

FIG. 19

| Selected WL,SGD,SGS \ WL,SGD,SGS | WL0 | WL1 | WL2 | WL3 | WL4 | WL5 | WL6 | WL7 |
|---|---|---|---|---|---|---|---|---|
| SGD | VSGD =3V | VSGD | VSGD | VSGD | VSGD | VSGD | VSGD | VSGD |
| WLDD0 | VPASS6 =3.4V | VPASS6 | VPASS6 | VPASS6 | VPASS6 | VPASS6 | VPASS6 | VPASS6 |
| WLDD1 | VPASS5 | VPASS5 | VPASS5 | VPASS5 | VPASS5 | VPASS5 | VPASS5 | VPASS5 |
| WL7 | VPASS2 | VPASS2 | VPASS2 | VPASS2 | VPASS2 | VPASS3 | VPASS3 | VPGM |
| WL6 | VPASS2 | VPASS2 | VPASS2 | VPASS2 | VPASS3 | VPASS3 | VPGM | VPASS4 |
| WL5 | VPASS2 | VPASS2 | VPASS2 | VPASS3 | VPASS3 | VPGM | VPASS4 | VPASS1 |
| WL4 | VPASS2 | VPASS2 | VPASS3 | VPASS3 | VPGM | VPASS4 | VPASS1 | VPASS1 |
| WL3 | VPASS2 =5V | VPASS3 | VPASS3 | VPGM | VPASS4 | VPASS1 | VPASS1 | VPASS1 |
| WL2 | VPASS3 | VPASS3 | VPGM | VPASS4 | VPASS1 | VPASS1 | VPASS1 | VPASS1 |
| WL1 | VPASS3 =8V | VPGM | VPASS4 | VPASS1 | VPASS1 | VPASS1 | VPASS1 | VPASS1 |
| WL0 | VPGM =14V | VPASS4 | VPASS1 =4V | VPASS1 | VPASS1 | VPASS1 | VPASS1 | VPASS1 |
| WLDS1 | VPASS5 =6V | VPASS5 | VPASS5 | VPASS5 | VPASS5 | VPASS5 | VPASS5 | VPASS5 |
| WLDS0 | VPASS4 =6V | VPASS4 | VPASS6 | VPASS6 | VPASS6 | VPASS6 | VPASS6 | VPASS6 |
| SGS | VSGS =0V | VSGS | VSGS | VSGS | VSGS | VSGS | VSGS | VSGS |

FIG. 21

| Selected WL<br>WL,SGD,SGS | WL0 | WL1 | WL2 | WL3 | WL4 | WL5 | WL6 | WL7 |
|---|---|---|---|---|---|---|---|---|
| SGD | VSGD<br>=3V | VSGD | VSGD | VSGD | VSGD | VSGD | VSGD | VSGD |
| WLDD0 | VPASS6<br>=3.4V | VPASS6 | VPASS6 | VPASS6 | VPASS6 | VPASS6 | VPASS6 | VPASS6 |
| WLDD1 | VPASS5<br>=6V | VPASS5 | VPASS5 | VPASS5 | VPASS5 | VPASS5 | VPASS5 | VPASS5 |
| WL7 | VPASS2 | VPASS2 | VPASS2 | VPASS2 | VPASS2 | VPASS3 | VPASS3 | VPGM |
| WL6 | VPASS2 | VPASS2 | VPASS2 | VPASS2 | VPASS3 | VPASS3 | VPGM | VPASS4 |
| WL5 | VPASS2 | VPASS2 | VPASS2 | VPASS3 | VPASS3 | VPGM | VPASS4 | VPASS1 |
| WL4 | VPASS2 | VPASS2 | VPASS3 | VPASS3 | VPGM | VPASS4 | VPASS1 | VPASS1 |
| WL3 | VPASS2 | VPASS3 | VPASS3 | VPGM | VPASS4 | VPASS1 | VPASS1 | VPASS1 |
| WL2 | VPASS2<br>=5V | VPASS3 | VPGM | VPASS4 | VPASS1 | VPASS1 | VPASS1 | VPASS1 |
| WL1 | VPASS3<br>=8V | VPGM | VPASS4 | VPASS1 | VPASS1 | VPASS1 | VPASS1 | VPASS1 |
| WL0 | VPGM<br>=14V | VPASS4 | VPASS1<br>=4V | VPASS1 | VPASS1 | VPASS1 | VPASS1 | VPASS1 |
| WLDS1 | VPASS7<br>=10V | VPASS5 | VPASS5 | VPASS5 | VPASS5 | VPASS5 | VPASS5 | VPASS5 |
| WLDS0 | VPASS4<br>=6V | VPASS4 | VPASS6 | VPASS6 | VPASS6 | VPASS6 | VPASS6 | VPASS6 |
| SGS | VSGS<br>=0V | VSGS | VSGS | VSGS | VSGS | VSGS | VSGS | VSGS |

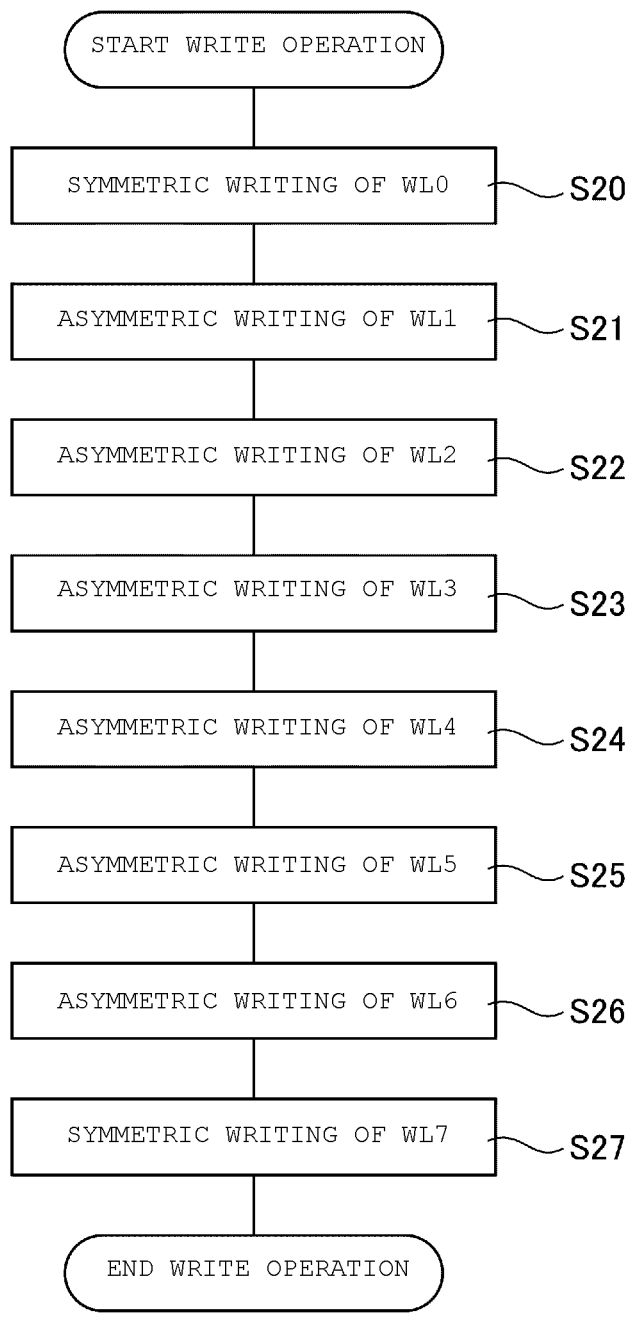

FIG. 24

| Selected WL → <br> WL,SGD,SGS ↓ | WL0 | WL1 | WL2 | WL3 | WL4 | WL5 | WL6 | WL7 |
|---|---|---|---|---|---|---|---|---|
| SGD | VSGD=3V | VSGD | VSGD | VSGD | VSGD | VSGD | VSGD | VSGD |
| WLDD0 | VPASS6=3.4V | VPASS6 | VPASS6 | VPASS6 | VPASS6 | VPASS6 | VPASS6 | VPASS2 |
| WLDD1 | VPASS5=6V | VPASS5 | VPASS5 | VPASS5 | VPASS5 | VPASS5 | VPASS5 | VPASS7 |
| WL7 | VPASS2 | VPASS2 | VPASS2 | VPASS2 | VPASS2 | VPASS3 | VPASS3 | VPGM |
| WL6 | VPASS2 | VPASS2 | VPASS2 | VPASS2 | VPASS3 | VPASS3 | VPGM | VPASS7 |
| WL5 | VPASS2 | VPASS2 | VPASS2 | VPASS3 | VPASS3 | VPGM | VPASS4 | VPASS1 |
| WL4 | VPASS2 | VPASS2 | VPASS3 | VPASS3 | VPGM | VPASS4 | VPASS1 | VPASS1 |
| WL3 | VPASS2 | VPASS3 | VPASS3 | VPGM | VPASS4 | VPASS1 | VPASS1 | VPASS1 |
| WL2 | VPASS2 | VPASS3 | VPGM | VPASS4 | VPASS1 | VPASS1 | VPASS1 | VPASS1 |
| WL1 | VPASS2=5V | VPGM | VPASS4 | VPASS1 | VPASS1 | VPASS1 | VPASS1 | VPASS1 |
| WL0 | VPGM=14V | VPASS3=8V | VPASS1=4V | VPASS1 | VPASS1 | VPASS1 | VPASS1 | VPASS1 |
| WLDS1 | VPASS7=10V | VPASS4 | VPASS5 | VPASS5 | VPASS5 | VPASS5 | VPASS5 | VPASS5 |
| WLDS0 | VPASS4=6V | VPASS4 | VPASS6 | VPASS6 | VPASS6 | VPASS6 | VPASS6 | VPASS6 |
| SGS | VSGS=0V | VSGS | VSGS | VSGS | VSGS | VSGS | VSGS | VSGS |

SEMICONDUCTOR MEMORY DEVICE

CROSS-REFERENCE TO RELATED APPLICATION(S)

This application is a continuation of U.S. patent application Ser. No. 16/808,187, filed Mar. 3, 2020, which is based upon and claims the benefit of priority from Japanese Patent Application No. 2019-168382, filed Sep. 17, 2019, the entire contents of which are incorporated herein by reference.

FIELD

Embodiments described herein relate generally to a semiconductor memory device.

BACKGROUND

A semiconductor memory device in which memory cells are three-dimensionally arranged is known.

DESCRIPTION OF THE DRAWINGS

FIG. 19 is a diagram illustrating voltages applied to word lines, dummy word lines, and select gate lines in the write operation.

FIG. 21 is a diagram illustrating voltages applied to word lines, dummy word lines, and select gate lines in the write operation according to the first modification example.

FIG. 23 is a flowchart illustrating a write operation according to a second modification example of the first embodiment.

FIG. 24 is a diagram illustrating voltages applied to word lines, dummy word lines, and select gate lines in the write operation according to the second modification example.

DETAILED DESCRIPTION

Embodiments provide a semiconductor memory device capable of improving reliability of a write operation.

In general, according to one embodiment, a semiconductor memory device includes a first memory cell provided above a substrate, a first word line electrically connected to the first memory cell, a second memory cell provided above the first memory cell and connected in series with the first memory cell, a second word line electrically connected to the second memory cell, a third memory cell provided above the second memory cell and connected in series with the second memory cell, a third word line electrically connected to the third memory cell, a fourth memory cell provided above the third memory cell and connected in series with the third memory cell, a fourth word line electrically connected to the fourth memory cell, and a driver circuit configured to apply voltages to the first, second, third, and fourth word lines when data is written to a memory cell in a write operation. The driver circuit is configured to, in a first write operation for writing data to the second memory cell, apply a first write voltage to the second word line, apply a first voltage lower than the first write voltage to the first word line, and apply a second voltage higher than the first voltage and lower than the first write voltage to the third and fourth word lines.

Hereinafter, embodiments will be described with reference to the drawings. In the following description, components having the same functions and configurations are denoted by common reference symbols. In addition, each embodiment to be described exemplifies a device and a method for embodying the technical spirit of the embodiments, and a material, a shape, a structure, a disposition, and the like of the component are not specified by ones to be described below.

Each functional block may be implemented by hardware, computer software, or a combination of hardware and computer software. It is not essential that each functional block is separated as in the following example. For example, some functions may be executed by a functional block different from the illustrated functional block. Further, the illustrated functional block may be divided into smaller functional sub-blocks. Here, a three-dimensional stack type NAND flash memory in which memory cell transistors are stacked above a semiconductor substrate will be described as an example of the semiconductor memory device. In this specification, a memory cell transistor may be referred to as a memory cell.

1. First Embodiment

Hereinafter, a semiconductor memory device according to a first embodiment will be described.

1.1 Configuration of Semiconductor Memory Device

A configuration of the semiconductor memory device according to the first embodiment will be described with reference to FIG. 1. The semiconductor memory device according to the first embodiment is, for example, a NAND flash memory 10 configured to store data in a nonvolatile manner.

Figure 1:
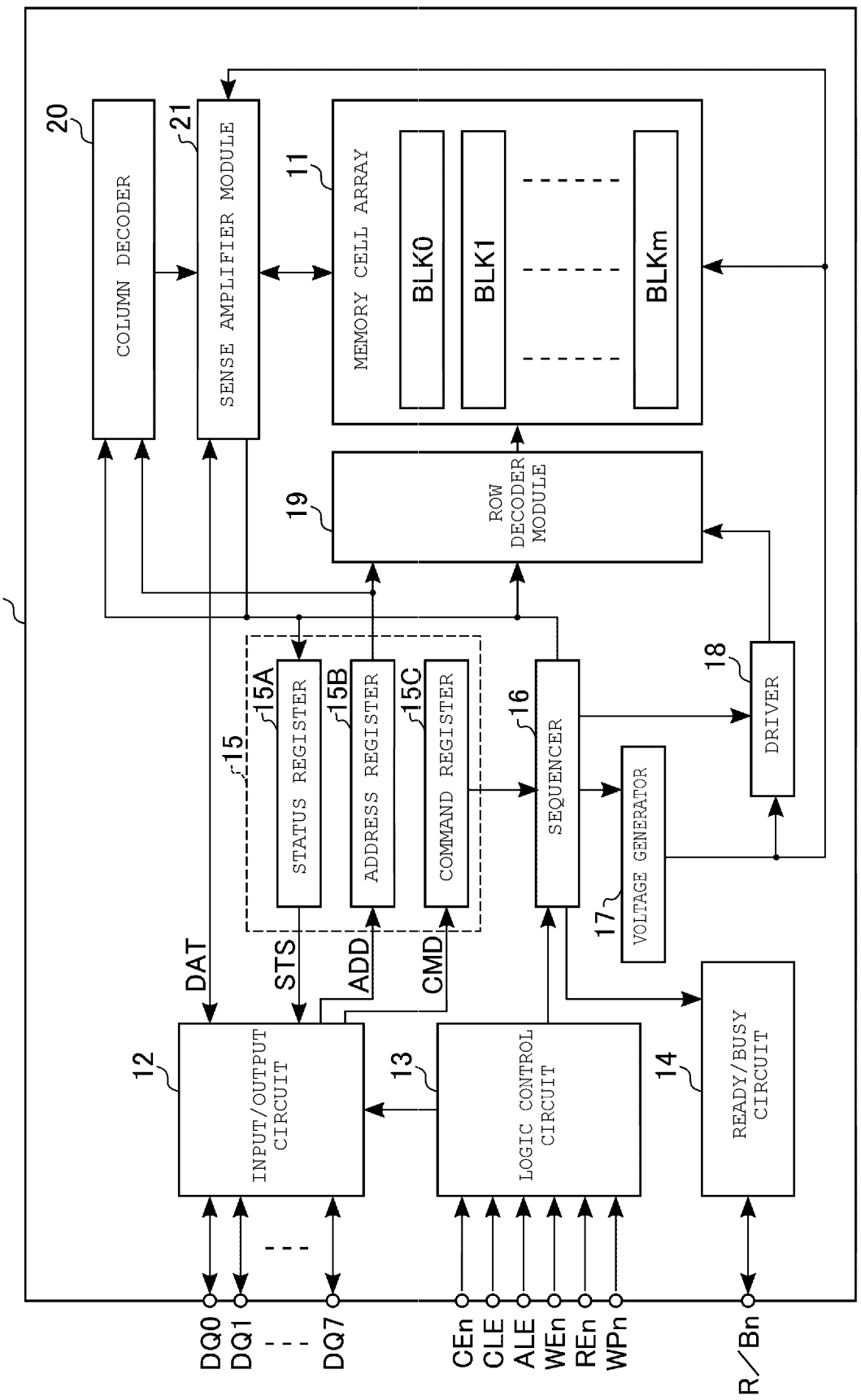
FIG. 1 is a block diagram illustrating a configuration of a semiconductor memory device according to a first embodiment.

FIG. 1 is a block diagram illustrating a configuration of the semiconductor memory device according to the first embodiment. A NAND flash memory 10 includes a memory cell array 11, an input/output circuit 12, a logic control circuit 13, a ready/busy circuit 14, a register group 15, a sequencer (or a control circuit) 16, a voltage generator 17, a driver 18, a row decoder module 19, a column decoder 20, and a sense amplifier module 21. The register group 15 includes a status register 15A, an address register 15B, and a command register 15C.

The memory cell array 11 includes one or more blocks BLK0, BLK1, BLK2, . . . , BLKm (m is an integer equal to or larger than 0). Each of the plurality of blocks BLK includes a plurality of memory cell transistors corresponding to rows and columns. The memory cell transistors are nonvolatile memory cells in which information can be electrically erased and programmed. The memory cell array 11 includes a plurality of word lines, a plurality of bit lines, and a source line in order to apply a voltage to the memory cell transistors. Hereinafter, each of the blocks BLK0 to BLKm is represented as the block BLK. A specific configuration of the block BLK will be described below.

The input/output circuit 12 and the logic control circuit 13 are connected to an external device (for example, a memory controller) (not illustrated) via an input/output terminal. The input/output circuit 12 transmits and receives a signal DQ (for example, DQ0, DQ1, DQ2, . . . , DQ7) to and from the memory controller via the input/output terminal.

The logic control circuit 13 receives external control signals from the memory controller via the input/output terminal. The external control signals include, for example, a chip enable signal CEn, a command latch enable signal CLE, an address latch enable signal ALE, a write enable signal WEn, a read enable signal REn, and a write protect signal WPn. The "n" appended to the signal name indicates that the signal is an active low signal.

The chip enable signal CEn enables selection of the NAND flash memory 10, and is asserted when the NAND flash memory 10 is selected. The command latch enable signal CLE enables a command transmitted as the signal DQ to be latched in the command register 15C. The address latch enable signal ALE enables an address transmitted as the signal DQ to be latched in the address register 15B. The write enable signal WEn enables data transmitted as the signal DQ to be stored in the input/output circuit 12. The read enable signal REn enables data read from the memory cell array 11 to be output as the signal DQ. The write protect signal WPn is asserted when writing and erasing to and from the NAND flash memory 10 are prohibited.

The ready/busy circuit 14 generates a ready/busy signal R/Bn according to a control from the sequencer 16. The signal R/Bn indicates whether the NAND flash memory 10 is in a ready state or a busy state. The ready state indicates a state where a command from the memory controller can be received. The busy state indicates a state where a command from the memory controller cannot be received. The memory controller receives the signal R/Bn from the NAND flash memory 10, and thus the memory controller can recognize whether the NAND flash memory 10 is in the ready state or the busy state based on the received signal R/Bn.

The status register 15A stores status information STS required for an operation of the NAND flash memory 10, and transmits the status information STS to the input/output circuit 12 based on an instruction from the sequencer 16. The address register 15B stores address information ADD transmitted from the input/output circuit 12. The address information ADD includes a column address and a row address. The row address includes, for example, a block address for specifying a block BLK to be operated and a page address for specifying a word line to be operated in the specified block. The command register 15C stores a command CMD transmitted from the input/output circuit 12. The command CMD includes, for example, a write command for instructing the sequencer 16 to perform a write operation, a read command for instructing the sequencer 16 to perform a read operation, and the like. For example, the status register 15A, the address register 15B, and the command register 15C are SRAMs.

The sequencer 16 receives a command from the command register 15C, and overall controls the NAND flash memory 10 according to a sequence based on the command. The sequencer 16 executes a write operation, a read operation, and an erasing operation by controlling the row decoder module 19, the sense amplifier module 21, the voltage generator 17, and the like. Specifically, the sequencer 16 writes data in the plurality of memory cell transistors specified by the address information ADD by controlling the row decoder module 19, the driver 18, and the sense amplifier module 21 based on the write command received from the command register 15C. The sequencer 16 also reads data from the plurality of memory cell transistors specified by the address information ADD by controlling the row decoder module 19, the driver 18, and the sense amplifier module 21 based on the read command received from the command register 15C.

The voltage generator 17 receives a power voltage from the outside of the NAND flash memory 10 via a power terminal which is not illustrated. A plurality of voltages required for a write operation, a read operation, and an erasing operation are generated using the power voltage. The voltage generator 17 supplies the generated voltage to the memory cell array 11, the driver 18, the sense amplifier module 21, and the like.

The driver 18 receives the plurality of voltages supplied from the voltage generator 17. The driver 18 supplies a plurality of voltages, which are selected according to a read operation, a write operation, and an erasing operation, among the plurality of voltages supplied from the voltage generator 17, to the row decoder module 19 via a plurality of signal lines.

The row decoder module 19 receives a row address from the address register 15B, and decodes the row address. The row decoder module 19 selects one of the blocks BLK based on the decoding result of the row address, and further selects a word line in the selected block BLK. Further, the row decoder module 19 transmits the plurality of voltages supplied from the driver 18 to the selected block BLK.

The column decoder 20 receives a column address from the address register 15B, and decodes the column address. The column decoder 20 selects a bit line based on the decoding result of the column address.

The sense amplifier module 21 detects and amplifies data which is read from the memory cell transistor to the bit line in a data read operation. The sense amplifier module 21 temporarily stores read data DAT which is read from the memory cell transistor, and transmits the read data DAT to the input/output circuit 12. The sense amplifier module 21 temporarily stores write data DAT transmitted from the input/output circuit 12 in a data write operation. Further, the sense amplifier module 21 transmits the write data DAT to the bit line.

1.1.1 Circuit Configuration of Memory Cell Array 11

Next, a circuit configuration of the memory cell array 11 will be described. As described above, the memory cell array 11 includes the plurality of blocks BLK0 to BLKm. Here, although a circuit configuration of one block BLK will be described, circuit configurations of the other blocks are the same.

Figure 2:
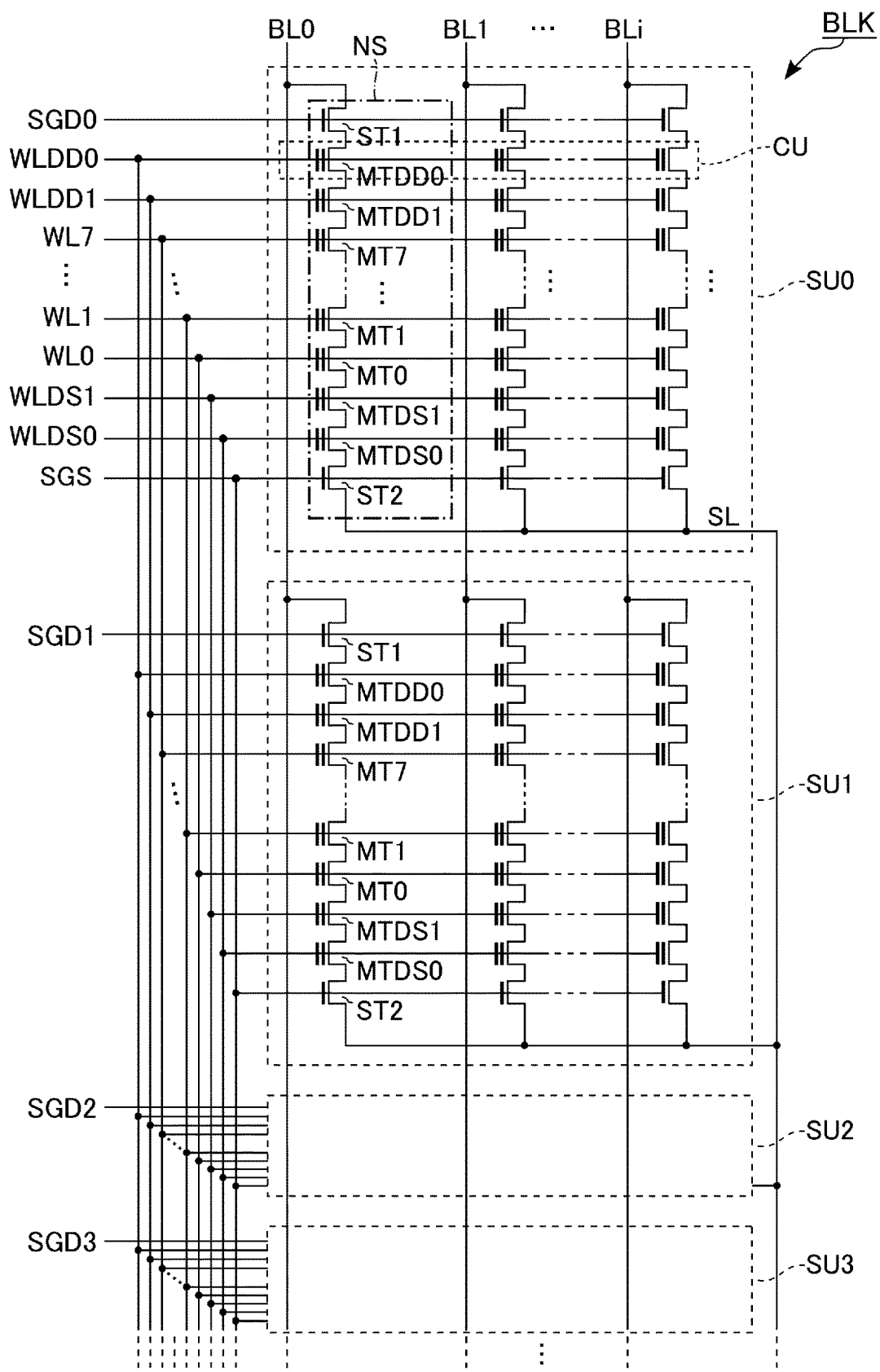
FIG. 2 is a circuit diagram of a block of a memory cell array in the semiconductor memory device.

FIG. 2 is a circuit diagram of one block BLK in the memory cell array 11. The block BLK includes a plurality of string units SUs. Here, as an example, the block BLK includes string units SU0, SU1, SU2, and SU3. The number of string units in the block BLK may be freely set. Hereinafter, each of the string units SU0 to SU3 is represented as the string unit SU.

Each of the plurality of string units SUs includes a plurality of NAND strings (or memory strings) NSs. The number of the NAND strings NSs included in one string unit SU may be freely set.

The NAND string NS includes a plurality of memory cell transistors MT0, MT1, MT2, . . . , and MT7, dummy memory cell transistors MTDD0, MTDD1, MTDS0, and MTDS1, and select transistors ST1 and ST2. Here, for simplicity of explanation, the NAND string NS including eight memory cell transistors MT0 to MT7, four dummy memory cell transistors MTDD0, MTDD1, MTDS0, and MTDS1, and two select transistors ST1 and ST2 will be described. On the other hand, the number of the memory cell transistors, the dummy memory cell transistors, and select transistors in the NAND string NS may be freely set. Hereinafter, each of the memory cell transistors MT0 to MT7 is represented as the memory cell transistor MT.

Each of the memory cell transistors MT0 to MT7 includes a control gate and a charge storage layer, and stores data in a nonvolatile manner. Each of the dummy memory cell transistors MTDD0, MTDD1, MTDS0, and MTDS1 includes a control gate and a charge storage layer similarly to the memory cell transistor MT, and is a memory cell transistor that may be not used for storing data or may be used for storing invalid data. The dummy memory cell transistors MTDD0 and MTDD1, the memory cell transistors MT0 to MT7, and the dummy memory cell transistors MTDS0 and MTDS1 are connected in series between a source of the select transistor ST1 and a drain of the select transistor ST2.

The memory cell transistor MT can store 1-bit data or data of 2 bits or more. The memory cell transistor MT may be a metal-oxide-nitride-oxide-silicon (MONOS) transistor using an insulating film as a charge storage layer, or a floating gate (FG) transistor using a conductive layer as a charge storage layer.

Gates of the plurality of select transistors ST1 in the string unit SU0 are connected to a select gate line SGD0. Similarly, gates of the select transistors ST1 of each of the string units SU1 to SU3 are respectively connected to select gate lines SGD1 to SGD3. Each of the select gate lines SGD0 to SGD3 can be independently controlled by the row decoder module 19.

Gates of the plurality of select transistors ST2 in the string unit SU0 are connected to a select gate line SGS. Similarly, gates of the select transistors ST2 of each of the string units SU1 to SU3 are connected to the select gate line SGS. The select transistor ST1 is used for selecting the string unit SU in various operations. Further, individual select gate lines SGS may be respectively connected to the string units SU0 to SU3 in the block BLK. In this case, the select transistors ST1 and ST2 are used for selecting the string unit SU in various operations.

Control gates of the memory cell transistors MT0 to MT7 and the dummy memory cell transistors MTDD0, MTDD1, MTDS0, and MTDS1 in the block BLK are respectively connected to word lines WL0 to WL7 and word lines WLDD0, WLDD1, WLDS0, and WLDS1. Each of the word lines WL0 to WL7 and the word lines WLDD0, WLDD1, WLDS0, and WLDS1 can be independently controlled by the row decoder module 19.

Each of bit lines BL0 to BLi (i is an integer equal to or larger than 0) is connected to the plurality of blocks BLK, and is connected to one NAND string NS in the string unit SU of the block BLK. That is, each of the bit lines BL0 to BLi is connected to drains of the select transistors ST1 of the plurality of NAND strings NSs in the same column, among the NAND strings NSs arranged in a matrix configuration in the block BLK. Further, a source line SL is connected to the plurality of blocks BLK. The source line SL is connected to sources of the plurality of select transistors ST2 in the block BLK.

In short, the string unit SU includes the plurality of NAND strings NSs that are connected to the bit lines BLs different from each other and are connected to the same select gate line SGD. In addition, the block BLK includes the plurality of string units SUs that are connected to the common word lines WLs. Further, the memory cell array 11 includes the plurality of blocks BLK that are connected to the common bit lines BLs.

The block BLK is, for example, a unit of data erasing. That is, data stored in the memory cell transistors MT of the same block BLK is erased together. The data may be erased in a unit of the string unit SU or may be erased in a unit with a size smaller than a size of the string unit SU.

The plurality of memory cell transistors MT that share the word line WL in one string unit SU are referred to as a cell unit CU. A set of 1-bit data stored in each of the plurality of memory cell transistors MT included in the cell unit CU is referred to as a page. A storage capacity of the cell unit CU changes according to the number of bits of the data stored in the memory cell transistors MT. For example, the cell unit CU stores 1-page data when each of the memory cell transistors MT stores 1-bit data, stores 2-page data when each of the memory cell transistors MT stores 2-bit data, or stores 3-page data when each of the memory cell transistors MT stores 3-bit data.

A write operation and a read operation to and from the cell unit CU are performed using a page as a unit of writing or a unit of reading. In other words, in the read operation and the write operation, one write operation or one read operation to and from the plurality of memory cell transistors MT, which are connected to one word line WL in one string unit SU, is performed.

In addition, the memory cell array 11 may have another configuration. That is, a configuration of the memory cell array 11 is described in, for example, U.S. patent application Ser. No. 12/407,403 filed on Mar. 19, 2009, "THREE DIMENSIONAL STACKED NONVOLATILE SEMICONDUCTOR MEMORY". Further, a configuration of the memory cell array 11 is described in, U.S. patent application Ser. No. 12/406,524 filed Mar. 18, 2009, "THREE DIMENSIONAL STACKED NONVOLATILE SEMICONDUCTOR MEMORY", U.S. patent application Ser. No. 12/679,991 filed on Mar. 25, 2010, "NON-VOLATILE SEMICONDUCTOR STORAGE DEVICE AND METHOD OF MANUFACTURING THE SAME", and U.S. patent application Ser. No. 12/532,030 filed on Mar. 23, 2009, "SEMICONDUCTOR MEMORY AND METHOD FOR MANUFACTURING SAME". The entire contents of these patent applications are incorporated herein by reference.

1.1.2 Sectional Structure of Memory Cell Array 11

Figure 3:
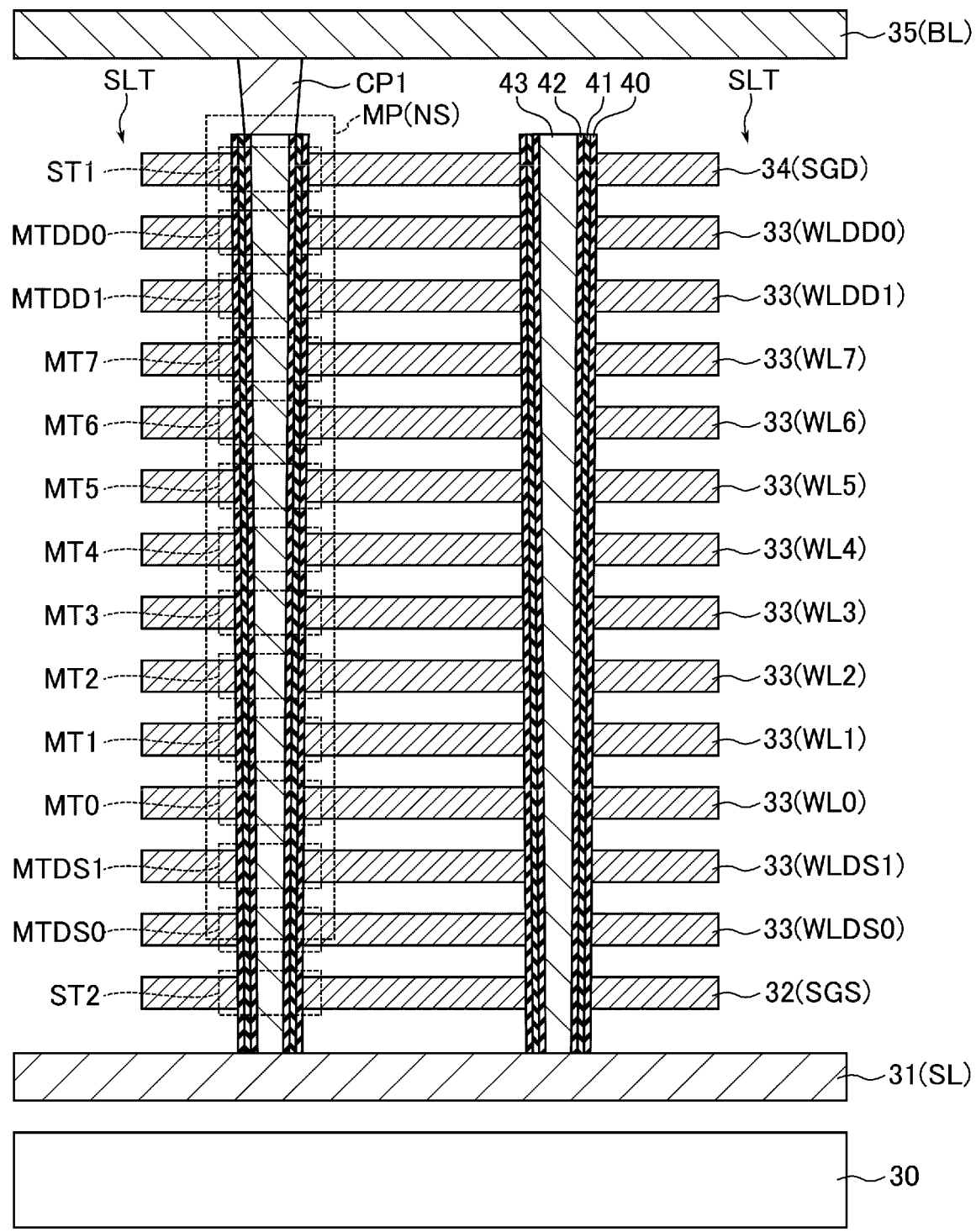
FIG. 3 is a sectional view of memory cell transistors of the memory cell array.

Next, a sectional structure of the memory cell transistors in the memory cell array 11 will be described. FIG. 3 is a sectional view of the memory cell transistors in the memory cell array 11 according to the first embodiment. In subsequent drawings including FIG. 3, it is assumed that two directions parallel to a surface of a semiconductor substrate 30 and perpendicular to each other are an X direction and a Y direction, and that a direction perpendicular to a plane including the X direction and the Y direction (i.e., an XY plane) is a Z direction (or a stack direction). In FIG. 3, interlayer insulating films between conductive layers are omitted.

As illustrated in FIG. 3, the memory cell array 11 includes a semiconductor substrate 30, conductive layers 31 to 34, memory pillars MPs, and a contact plug CP1. A conductive layer 31 is provided above the semiconductor substrate 30. The conductive layer 31 is formed in a flat plate shape parallel to the XY plane, and functions as the source line SL. The main surface of the semiconductor substrate 30 corresponds to the XY plane. The conductive layer 31 includes, for example, polysilicon in which impurities are doped.

A plurality of slits SLT along an XZ plane are arranged on the conductive layer 31 in the Y direction. A structure body (or a stacked body) between adjacent slits SLT on the conductive layer 31 corresponds to, for example, one string unit SU.

A conductive layer 32, a plurality of conductive layers 33, a conductive layer 34, and a conductive layer 35 are provided in this order from the lowest layer between adjacent slits SLT on the conductive layer 31. Among these conductive layers, conductive layers adjacent in the Z direction are stacked via interlayer insulating films. Each of the conductive layers 32 to 34 is formed in a flat plate shape parallel to the XY plane. The conductive layer 32 functions as the select gate line SGS. The plurality of conductive layers 33 respectively function as the dummy word lines WLDS0 and WLDS1, the word lines WL0 to WL7, and the dummy word lines WLDD1 and WLDD0 in this order from the lowest layer. The conductive layer 34 functions as the select gate line SGD. The conductive layers 32 to 34 include, for example, tungsten (W).

A plurality of memory pillars MPs are arranged, for example, in a staggered manner in the X direction and the Y direction. Each of the plurality of memory pillars MPs extends or penetrates through the stacked body between the slits SLT in the Z direction. Each of the memory pillars MPs is provided through the conductive layers 34, 33, and 32 so as to reach an upper surface of the conductive layer 31 from an upper surface of the conductive layer 34. Each of the memory pillars MPs functions as one NAND string NS.

The memory pillar MP includes, for example, a block insulating layer 40, a charge storage layer 41, a tunnel insulating layer (also referred to as a tunnel insulating film) 42, and a semiconductor layer 43. Specifically, a block insulating layer 40 is provided on an inner wall of a memory hole for forming the memory pillar MP. A charge storage layer 41 is provided on an inner wall of the block insulating layer 40. A tunnel insulating layer 42 is provided on an inner wall of the charge storage layer 41. Further, a semiconductor layer 43 is provided on an inner wall of the tunnel insulating layer 42. The memory pillar MP may have a structure in which a core insulating layer is provided inside the semiconductor layer 43.

In such a configuration of the memory pillar MP, a portion at which the memory pillar MP and the conductive layer 32 intersect with each other functions as the select transistor ST2. In addition, portions at which the memory pillar MP and the conductive layers 33 intersect with each other respectively function as the dummy memory cell transistors MTDS0 and MTDS1, the memory cell transistors MT0 to MT7, and the dummy memory cell transistors MTDD1 and MTDD0. Further, a portion at which the memory pillar MP and the conductive layer 34 intersect with each other functions as the select transistor ST1.

The semiconductor layer 43 functions as a channel layer for the dummy memory cell transistors MTDS0, MTDS1, MTDD0, and MTDD1, the memory cell transistors MT, and the select transistors ST1 and ST2. A current path of the NAND string NS is formed inside the semiconductor layer 43.

The charge storage layer 41 has a function of storing charges injected from the semiconductor layer 43 in the memory cell transistor MT. The charge storage layer 41 includes, for example, a silicon nitride film.

The tunnel insulating layer 42 functions as a potential barrier when charges are injected from the semiconductor layer 43 to the charge storage layer 41 or when charges stored in the charge storage layer 41 are dispersed to the semiconductor layer 43. The tunnel insulating layer 42 includes, for example, a silicon oxide film.

The block insulating film 40 prevents the charges stored in the charge storage layer 41 from dispersing to the conductive layer 33 (i.e., word line WL). The block insulating layer 40 includes, for example, a silicon oxide layer and a silicon nitride layer.

The conductive layer 35 is provided above an upper surface of the memory pillar MP via an interlayer insulating film. The conductive layer 35 is a line-shaped wiring layer extending in the Y direction, and functions as the bit line BL. A plurality of conductive layers 35 are arranged in the X direction, and each of the conductive layers 35 is electrically connected to one memory pillar MP corresponding to each string unit SU. Specifically, in each string unit SU, a contact plug CP1 is provided on the semiconductor layer 43 in each memory pillar MP, and one conductive layer 35 is provided on the contact plug CP1. The conductive layer 35 includes, for example, aluminum (Al) or tungsten (W). The contact plug CP1 includes, for example, tungsten (W).

The number of the word lines WLs and the number of the select gate lines SGD and SGS are respectively changed according to the number of the memory cell transistors MT and the number of the select transistors ST1 and ST2. The select gate line SGS may be configured with a plurality of conductive layers, which are respectively provided as a plurality of layers. The select gate line SGD may be configured with a plurality of conductive layers, which are respectively provided as a plurality of layers.

1.1.3 Threshold Voltage Distribution of Memory Cell Transistors

Figure 4:
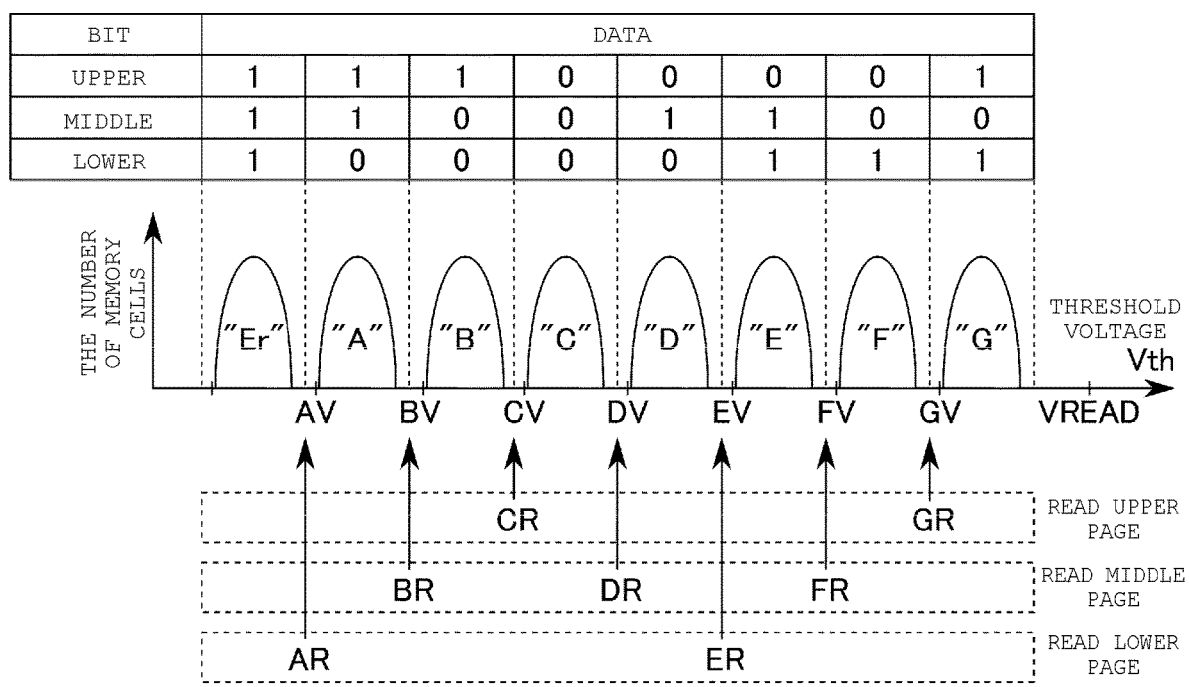
FIG. 4 is a diagram illustrating a relationship between a threshold voltage distribution of the memory cell transistors and data stored therein.

Next, a threshold voltage distribution of the memory cell transistors and data stored therein will be described. FIG. is a diagram illustrating a relationship between the threshold voltage distribution of the memory cell transistors MT and the data stored therein. FIG. 4 illustrates an example in which a triple-level cell (TLC) method capable of storing 3-bit data in one memory cell transistor MT is applied as a storage method of the memory cell transistor MT. In the present embodiment, a single-level cell (SLC) method capable of storing 1-bit data in one memory cell transistor MT, a multi-level cell (MLC) method capable of storing 2-bit data in one memory cell transistor MT, a quad-level cell (QLC) method capable of storing 4-bit data in one memory cell transistor MT, or the like may be applied.

The 3-bit data that can be stored in the memory cell transistor MT is defined by a lower bit, a middle bit, and an upper bit. When the memory cell transistor MT stores 3-bit data, the memory cell transistor MT can take anyone state among eight states corresponding to a plurality of threshold voltages. The eight states are referred to as states "Er", "A", "B", "C", "D", "E", "F", and "G" in order from the lowest. The plurality of memory cell transistors MT belonging to each of the states "Er", "A", "B", "C", "D", "E", "F", and "G" form a threshold voltage distribution as illustrated in FIG. 4.

For example, data "111", "110", "100", "000", "010", "011", "001", and "101" are respectively allocated to the states "Er", "A", "B", "C", "D", "E", "F", and "G". When it is assumed that the lower bit is "X", the middle bit is "Y", and the upper bit is "Z", the order of the bits is "Z, Y, X". The relationship between the threshold voltage distribution and the data may be freely set.

In order to read the data stored in the memory cell transistor MT as a read target, the state to which the threshold voltage of the memory cell transistor MT belongs is determined. In order to determine the state, read voltages AR, BR, CR, DR, ER, FR, and GR are used.

The state "Er" corresponds to, for example, a state where data is erased (i.e., an erased state). The threshold voltage of the memory cell transistor MT belonging to the state "Er" is lower than the read voltage AR, and has, for example, a negative value.

The states "A" to "G" correspond to states where charges are injected to the charge storage layer and thus data is written in the memory cell transistor MT. The threshold voltage of the memory cell transistor MT belonging to each of the states "A" to "G" has, for example, a positive value. The threshold voltage of the memory cell transistor MT belonging to the state "A" is higher than the read voltage AR and is equal to or lower than the read voltage BR. The threshold voltage of the memory cell transistor MT belonging to the state "B" is higher than the read voltage BR and is equal to or lower than the read voltage CR. The threshold voltage of the memory cell transistor MT belonging to the state "C" is higher than the read voltage CR and is equal to or lower than the read voltage DR. The threshold voltage of the memory cell transistor MT belonging to the state "D" is higher than the read voltage DR and is equal to or lower than the read voltage ER. The threshold voltage of the memory cell transistor MT belonging to the state "E" is higher than the read voltage ER and is equal to or lower than the read voltage FR. The threshold voltage of the memory cell transistor MT belonging to the state "F" is higher than the read voltage FR and is equal to or lower than the read voltage GR. The threshold voltage of the memory cell transistor MT belonging to the state "G" is higher than the read voltage GR and is lower than a voltage VREAD.

The voltage VREAD is a voltage which is applied to the word line WL connected to the memory cell transistors MT of the cell unit CU as non-read targets, and is higher than the threshold voltage of the memory cell transistor MT in any state. For this reason, the memory cell transistor MT in which the voltage VREAD is applied to the control gate enters an ON state regardless of the data to be stored.

A verification voltage used in each write operation is set between adjacent threshold voltage distributions. Specifically, verification voltages AV, BV, CV, DV, EV, FV, and GV are respectively set corresponding to the states "A", "B", "C", "D", "E", "F", and "G". For example, the verification voltages AV, BV, CV, DV, EV, FV, and GV are respectively set to voltages slightly higher than the read voltages AR, BR, CR, DR, ER, FR, and GR.

As described above, each memory cell transistor MT is set to be in one state among the eight states, and can store 3-bit data. Further, writing and reading are performed in units of pages in one cell unit CU. When the memory cell transistor MT stores 3-bit data, a lower bit, a middle bit, and an upper bit are respectively allocated to three pages in one cell unit CU. In the lower bits, the middle bits, and the upper bits stored in the cell unit CU, pages to be written by one write operation or pages to be read by one read operation, that is, a set of the lower bits, a set of the middle bits, and a set of the upper bits are respectively referred to as a lower page, a middle page, and an upper page.

When such data allocation is applied, the lower page is determined by a read operation using the read voltages AR and ER. The middle page is determined by a read operation using the read voltages BR, DR, and FR. The upper page is determined by a read operation using the read voltages CR and GR.

1.1.4 Configuration of Row Decoder Module 19

Figure 5:
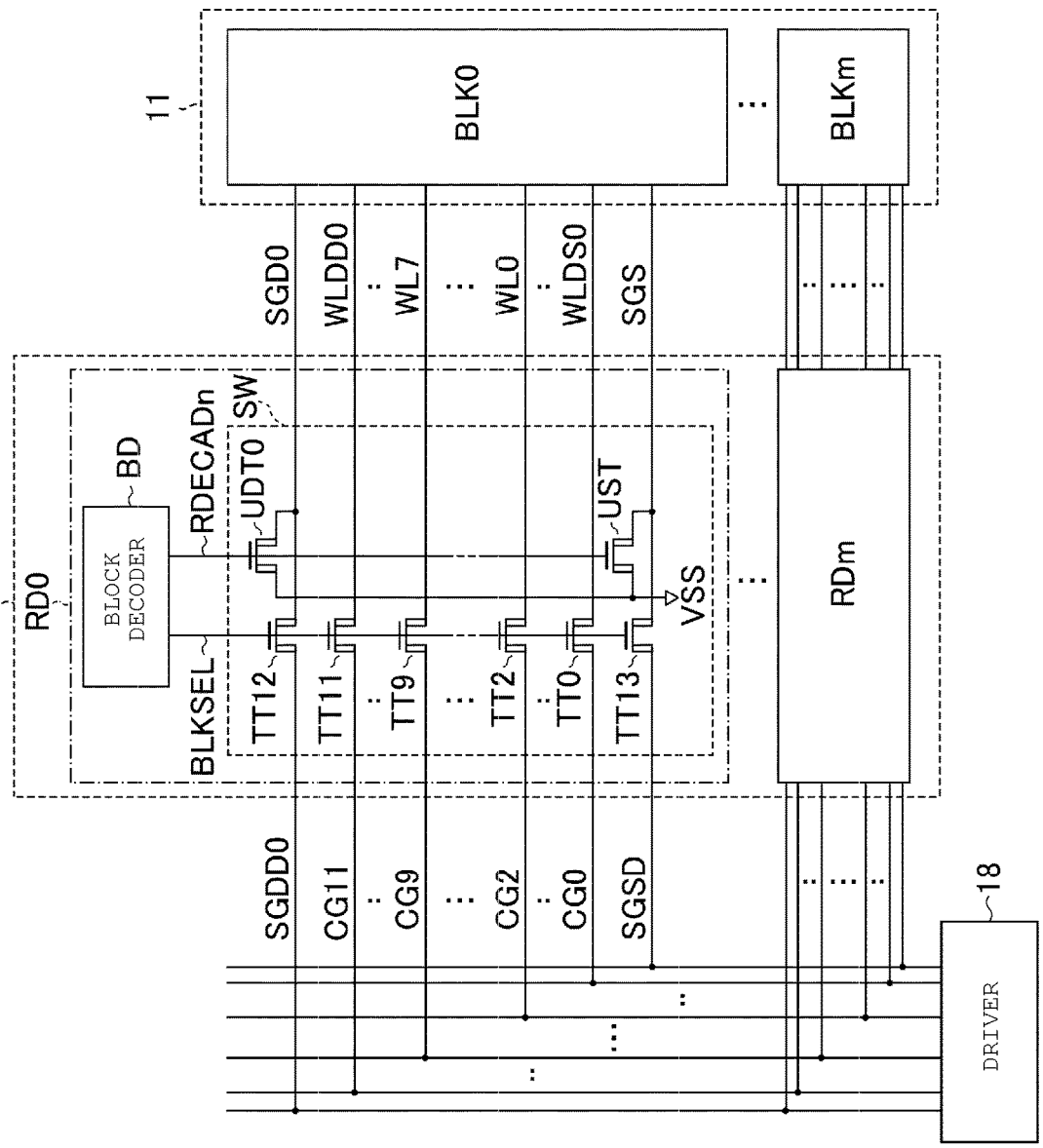
FIG. 5 is a block diagram of a row decoder module in the semiconductor memory device.

Next, a configuration of the row decoder module 19 illustrated in FIG. 1 will be described. FIG. 5 is a block diagram of the row decoder module 19 according to the first embodiment.

The row decoder module 19 includes a plurality of row decoders RD0, RD1, RD2, . . . , RDm. The row decoders RD0 to RDm are respectively provided corresponding to the blocks BLK0 to BLKm. Hereinafter, each of the row decoders RD0 to RDm is represented as the row decoder RD.

The row decoder RD includes a block decoder BD and a transmission switch group SW. The transmission switch group SW includes n-channel MOS transistors TT0, TT1, TT2, . . . , TT13, UDT0, and UST. As the transistors TT0 to TT13, UDT0, and UST, high breakdown voltage transistors may be used.

A signal BLKSEL is input to gates of the transistors TT0 to TT13. Drains of the transistors TT2 to TT9 are respectively connected to signal lines CG2 to CG9, and sources of the transistors TT2 to TT9 are respectively connected to the word lines WL0 to WL7. Drains of the transistors TT10 and TT11 are respectively connected to signal lines CG10 and CG11, and sources of the transistors TT10 and TT11 are respectively connected to the dummy word lines WLDD1 and WLDD0. Drains of the transistors TT0 and TT1 are respectively connected to signal lines CG0 and CG1, and sources of the transistors TT0 and TT1 are respectively connected to the dummy word lines WLDS0 and WLDS1. Drains of the transistors TT12 and TT13 are respectively connected to signal lines SGDD0 and SGSD, and sources of the transistors TT12 and TT13 are respectively connected to the select gate lines SGD0 and SGS.

A signal RDECADn is input to gates of the transistors UDT0 and UST. A drain of the transistor UDT0 is connected to the select gate line SGD0, and a source of the transistor UDT0 is connected to a ground terminal to which a ground voltage VSS is applied. A drain of the transistor UST is connected to the select gate line SGS, and a source of the transistor UST is connected to the ground terminal to which the ground voltage VSS is applied.

The block decoder BD decodes a block address received from the address register 15B. When it is determined that the block BLK corresponding to the block decoder BD is the block BLK to be selected based on the decoding result of the block address, the block decoder BD outputs the signal BLKSEL having a high level and the signal RDECADn having a low level.

Thereby, in the transmission switch group SW corresponding to the selected block BLK, the transistors TT0 to TT13 enter an ON state, and the transistors UDT0 and UST enter an OFF state. As a result, the word lines WL0 to WL7 are respectively connected to the signal lines CG2 to CG9. The dummy word lines WLDD0, WLDD1, WLDS0, and WLDS1 are respectively connected to the signal lines CG11, CG10, CG0, and CG1. Further, the select gate lines SGD0 and SGS are respectively connected to the signal lines SGDD0 and SGSD.

On the other hand, when it is determined that the corresponding block BLK is not the block BLK to be selected, the block decoder BD outputs the signal BLKSEL having a low level and the signal RDECADn having a high level.

Thereby, in the transmission switch group SW corresponding to the non-selected block BLK, the transistors TT0 to TT13 enter an OFF state, and the transistors UDT0 and UST enter an ON state. As a result, the word lines WL0 to WL7 are respectively disconnected from the signal lines CG2 to CG9. The dummy word lines WLDD0, WLDD1, WLDS0, and WLDS1 are respectively disconnected from the signal lines CG11, CG10, CG0, and CG1. Further, the select gate lines SGD0 and SGS are respectively disconnected from the signal lines SGDD0 and SGSD.

The driver 18 supplies a voltage to the signal lines CG0 to CG11, and SGDD0 and SGSD according to the address received from the address register 15B. The voltage supplied from the driver 18 is applied to the word lines WLs and the select gate lines SGD0 and SGS in the selected block BLK via the transistors TT0 to TT13 in the transmission switch group SW corresponding to the selected block BLK.

Figure 6:
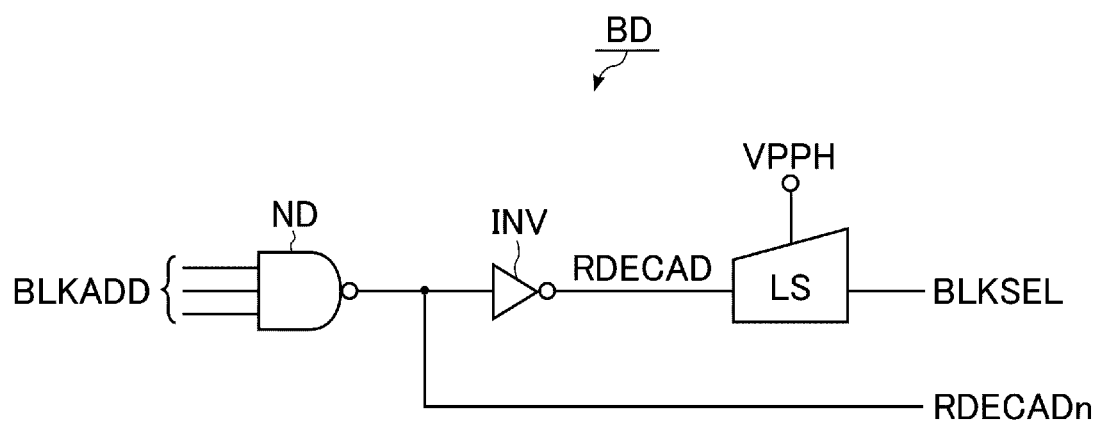
FIG. 6 is a circuit diagram of a block decoder of the row decoder module.

Next, an example of a configuration of the block decoder BD in the row decoder RD will be described. FIG. 6 is a circuit diagram of the block decoder BD illustrated in FIG. 5. The block decoder BD includes a NAND gate ND, an inverter INV, and a level shifter LS.

A block address BLKADD is input from the address register 15B to an input terminal of the NAND gate ND. In the block address BLKADD, all the bits are at a high level for a block to be selected, and at least one bit is at a low level for a non-selected block. The NAND gate ND outputs a signal RDECADn.

An input terminal of the inverter INV is connected to an output terminal of the NAND gate ND. The inverter INV outputs a signal RDECAD to the level shifter LS.

A boost voltage VPPH is supplied to the level shifter LS. The level shifter LS boosts the signal RDECAD. When the signal RDECAD is boosted, the level shifter LS uses the boost voltage VPPH as a target voltage. The level shifter LS outputs a signal BLKSEL obtained by boosting.

With the above configuration, the block decoder BD outputs the signal BLKSEL and the signal RDECADn having logic levels different from each other, to the transmission switch group SW.

1.1.5 Configuration of Sense Amplifier Module 21

Figure 7:
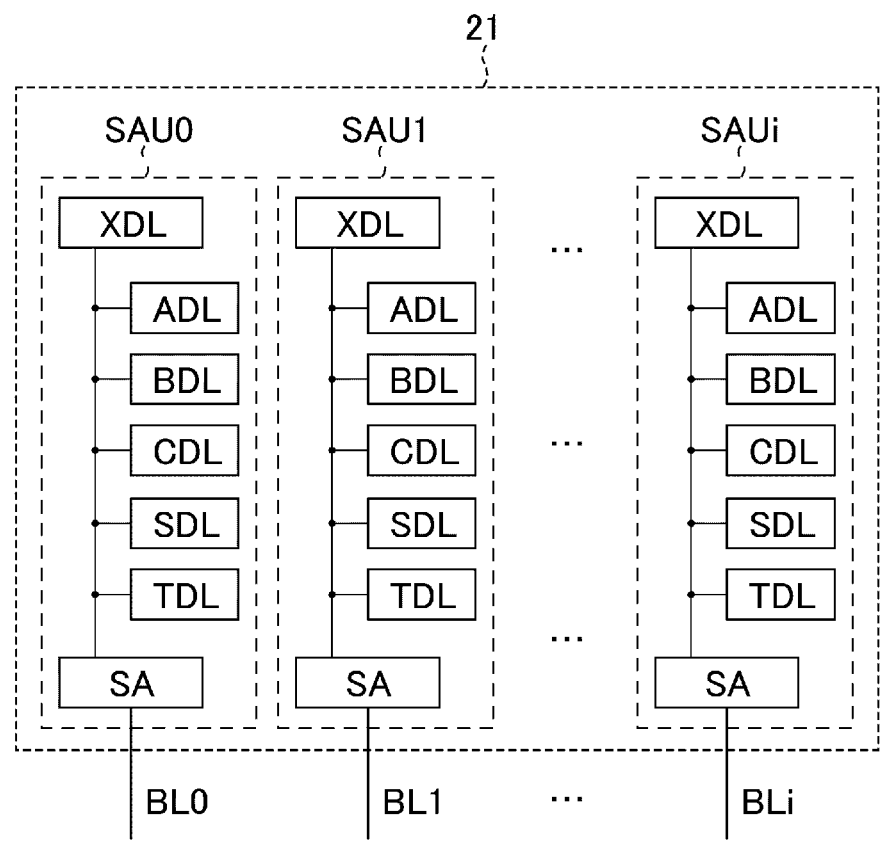
FIG. 7 is a block diagram of a sense amplifier module in the semiconductor memory device.

Next, a configuration of the sense amplifier module 21 illustrated in FIG. 1 will be described. FIG. 7 is a block diagram of the sense amplifier module 21 according to the first embodiment.

The sense amplifier module 21 includes sense amplifier units SAU0 to SAUi corresponding to the bit lines BL0 to BLi. Hereinafter, each of the sense amplifier units SAU0 to SAUi is represented as the sense amplifier unit SAU. The sense amplifier unit SAU includes a sense amplifier SA and data latch circuits ADL, BDL, CDL, SDL, TDL, and XDL. The sense amplifier SA and the data latch circuits ADL, BDL, CDL, SDL, TDL, and XDL are connected to each other such that data transmission can be performed therebetween.

The data latch circuits ADL, BDL, CDL, SDL, and TDL temporarily stores data. In a write operation, the sense amplifier SA controls a voltage of the bit line BL according to the data stored in the data latch circuit SDL. The data latch circuit TDL is used for data calculation in the sense amplifier module 21. The data latch circuits ADL, BDL, and CDL are used for multi-level operations when the memory cell transistor MT stores data of 2 bits or more. That is, the data latch circuit ADL is used to store bits of the lower page, the data latch circuit BDL is used to store bits of the middle page, and the data latch circuit CDL is used to store bits of the upper page. The number of the data latch circuits in the sense amplifier unit SAU may be freely set according to the number of the bits stored in one memory cell transistor MT.

The data latch circuit XDL temporarily stores data. The data latch circuit XDL is connected to the input/output circuit 12. The data latch circuit XDL temporarily stores write data transmitted from the input/output circuit 12, and temporarily stores read data transmitted from the data latch circuit SDL or the like. More specifically, data transmission between the input/output circuit 12 and the sense amplifier module 21 is performed via the data latch circuit XDL for one page. The write data received by the input/output circuit 12 is transmitted to one of the data latch circuits ADL, BDL, and CDL via the data latch circuit XDL. The read data read by the sense amplifier SA is transmitted to the input/output circuit 12 via the data latch circuit XDL. A set of the data latch circuits XDL is also referred to as a data cache.

In the read operation, the sense amplifier SA detects data which is read to the corresponding bit line BL, and determines whether the data is "0" or "1". Further, in the write operation, the sense amplifier SA applies the voltage to the bit line BL based on the write data.

Figure 8:
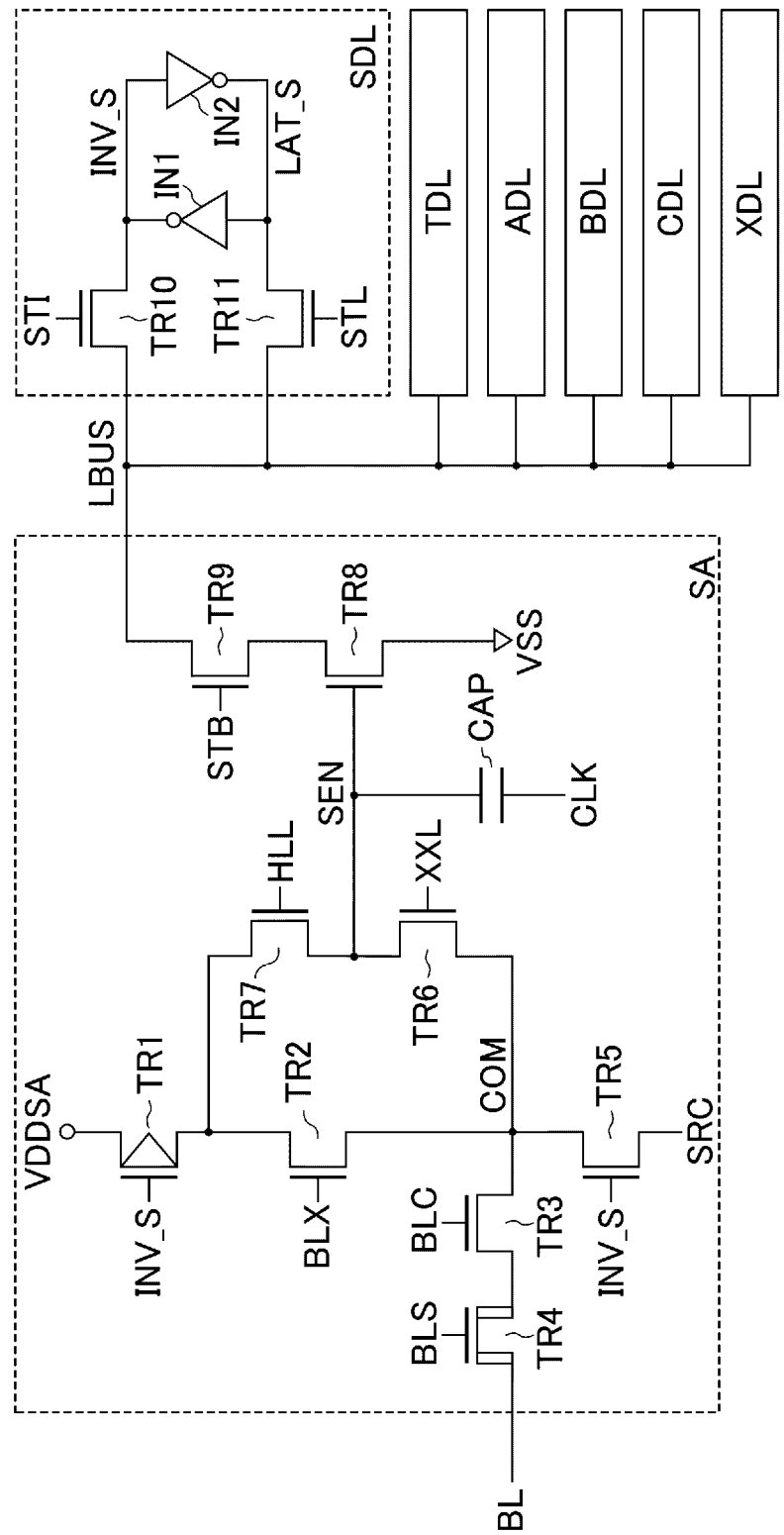
FIG. 8 is a circuit diagram of a sense amplifier unit of the sense amplifier module.

Next, a specific configuration example of the sense amplifier unit SAU in the sense amplifier module 21 will be described. FIG. 8 is a circuit diagram of the sense amplifier unit SAU in the sense amplifier module 21. A plurality of signals supplied to the sense amplifier unit SAU are controlled by the sequencer 16.

First, a circuit configuration of the sense amplifier SA will be described. The sense amplifier SA includes, for example, a p-channel MOS transistor TR1, n-channel MOS transistors TR2 to TR9, and a capacitor CAP.

A source of the transistor TR1 is connected to a power supply terminal to which a power voltage VDDSA for the sense amplifier is supplied, a drain of the transistor TR1 is connected to a drain of the transistor TR2, and a gate of the transistor TR1 is connected to a node INV_S in the data latch circuit SDL. A source of the transistor TR2 is connected to anode COM, and a signal BLX is input to a gate of the transistor TR2.

A drain of the transistor TR3 is connected to the node COM, and a signal BLC is input to a gate of the transistor TR3. A drain of the transistor TR4 is connected to a source of the transistor TR3, a source of the transistor TR4 is connected to the corresponding bit line BL, and a signal BLS is input to a gate of the transistor TR4. The transistor TR4 is a high breakdown voltage MOS transistor.

A drain of the transistor TR5 is connected to the node COM, a source of the transistor TR5 is connected to a node SRC, and a gate of the transistor TR5 is connected to the node INV_S. For example, a ground voltage VSS is supplied to the node SRC. A drain of the transistor TR6 is connected to a node SEN, a source of the transistor TR6 is connected to the node COM, and a signal XXL is input to a gate of the transistor TR6. A drain of the transistor TR7 is connected to the drain of the transistor TR1, a source of the transistor TR7 is connected to the node SEN, and a signal HLL is input to a gate of the transistor TR7.

A source of the transistor TR8 is connected to a ground terminal to which the ground voltage VSS is supplied, and a gate of the transistor TR8 is connected to the node SEN. A source of the transistor TR9 is connected to a drain of the transistor TR8, a drain of the transistor TR9 is connected to a bus LBUS, and a signal STB is input to a gate of the transistor TR9. The signal STB is used to control a timing for determining data which is read to the bit line BL.

One electrode of the capacitor CAP is connected to the node SEN, and a clock signal CLK is input to the other electrode of the capacitor CAP.

Next, a circuit configuration of the data latch circuit SDL will be described. The data latch circuit SDL includes inverters IN1 and IN2 and n-channel MOS transistors TR10 and TR11.

An input terminal of the inverter IN1 is connected to a node LAT_S, and an output terminal of the inverter IN1 is connected to the node INV_S. An input terminal of the inverter IN2 is connected to the node INV_S, and an output terminal of the inverter IN2 is connected to the node LAT_S. A drain of the transistor TR10 is connected to the node INV_S, a source of the transistor TR10 is connected to the bus LBUS, and a signal STI is input to a gate of the transistor TR10. A drain of the transistor TR11 is connected to the node LAT_S, a source of the transistor TR11 is connected to the bus LBUS, and a signal STL is input to a gate of the transistor TR11. For example, data stored in the node LAT_S corresponds to the data stored in the data latch circuit SDL, and data stored in the node INV_S corresponds to inverted data of the data stored in the node LAT_S. Since a circuit configuration of each of the data latch circuits ADL, BDL, CDL, TDL, and XDL is the same as that of the data latch circuit SDL, a description thereof will be omitted.

1.2 Write Operation According to First Embodiment

Figure 9:
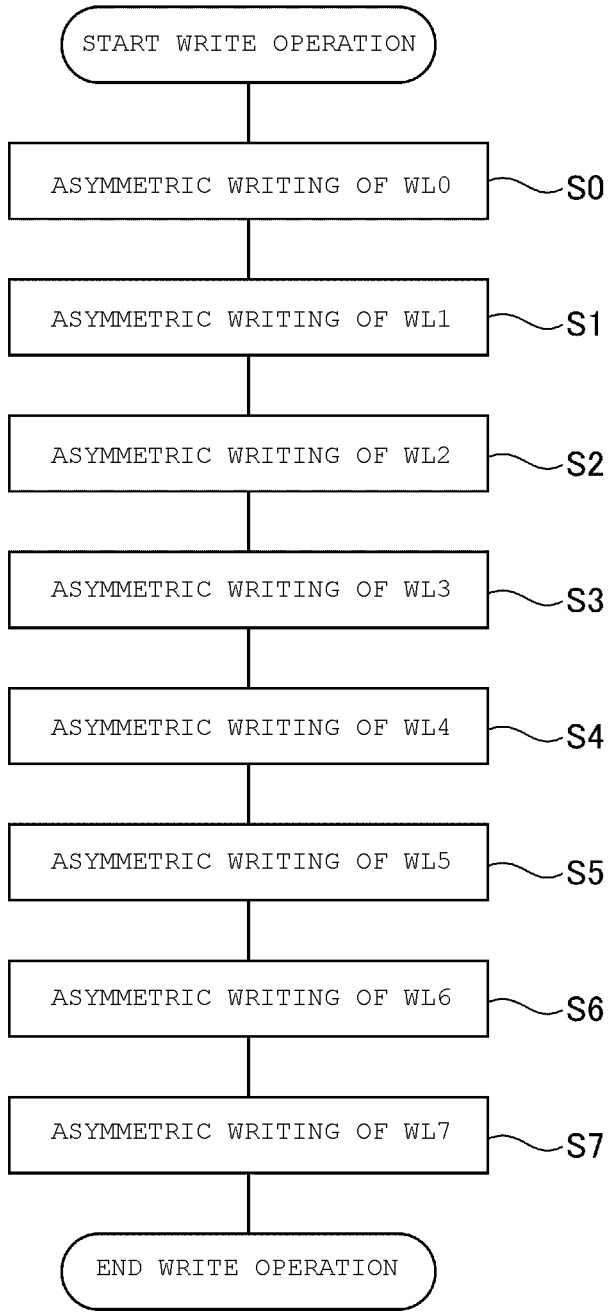
FIG. 9 is a flowchart illustrating a write operation in the semiconductor memory device according to the first embodiment.

Next, a write operation in the NAND flash memory 10 according to the first embodiment will be described. FIG. 9 is a flowchart illustrating a write operation in the NAND flash memory 10. The write operation is executed in a unit of one word line WL. As illustrated in FIG. 9, in the order of writing to the word lines WL0 to WL7, for example, writing to the plurality of memory cell transistors MTs connected to the word line WL0 (step S0) is performed, and subsequently, writing to the plurality of memory cell transistors MT connected to each of the word lines WL1, WL2, . . . , and WL7 (steps S1 to S7) is performed in order. Hereinafter, a case where a write target in writing is the word line WLn will be described.

Figure 10:
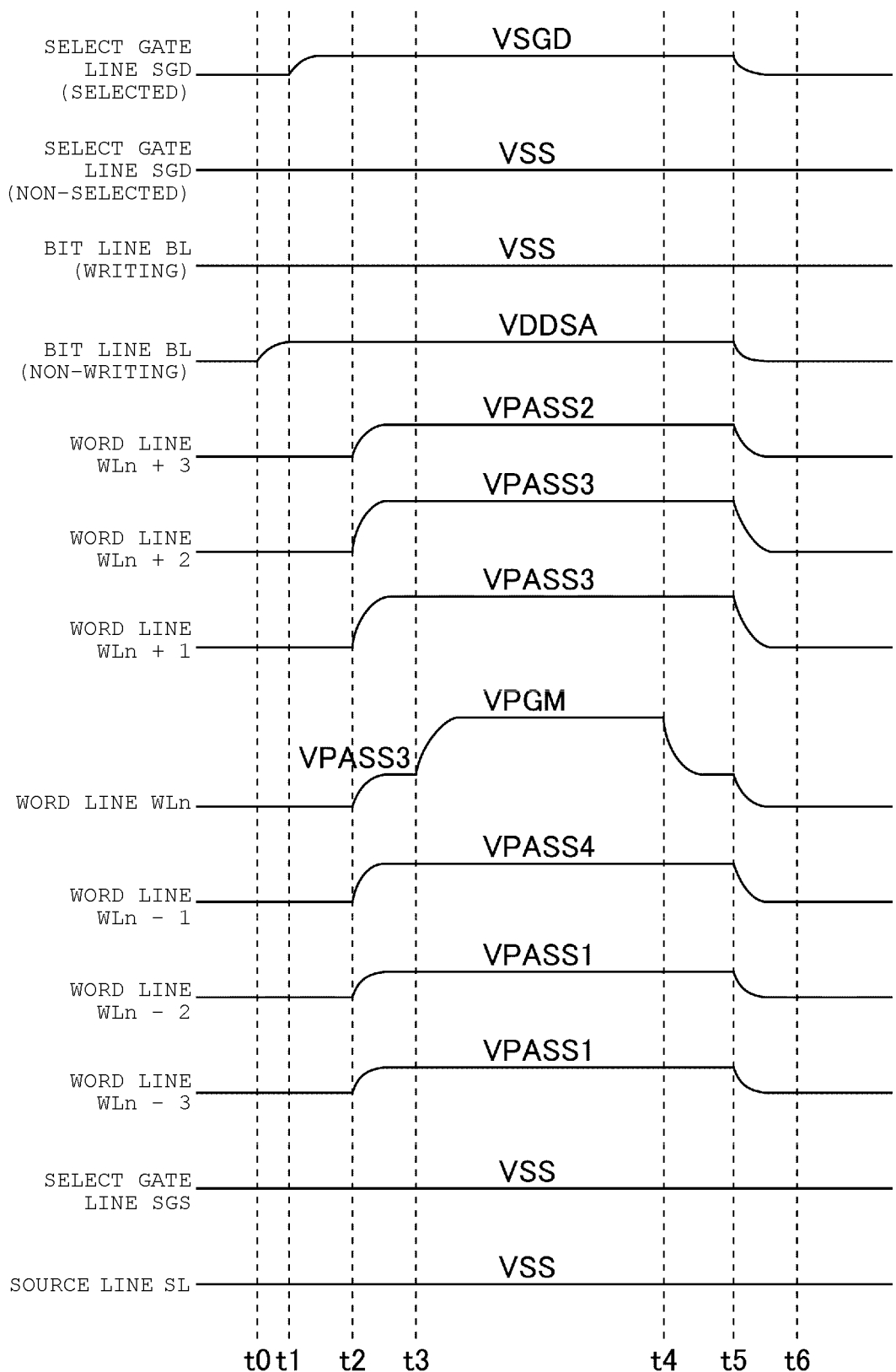
FIG. 10 is a timing chart of voltages applied to select gate lines, word lines, and bit lines in the write operation.

First, in writing, voltages applied to the select gate lines SGD and SGS, the word lines WLs, and the bit lines BLs, and timings at which the voltages are applied will be described with reference to FIG. 10. FIG. 10 is a timing chart of voltages applied to the select gate lines SGD and SGS, the word lines WLs, and the bit lines BLs in writing to the word lines WLn.

At a time t0, the sense amplifier module 21 applies the voltage VDDSA to the non-selected (or write-prohibited) bit line BL. The sense amplifier module 21 supplies the voltage VSS to the selected bit line BL. The voltage VDDSA is a voltage at which the select transistor ST1 enters an OFF state when a voltage VSGD is applied to the selected select gate line SGD. The voltage VSS is a ground voltage (for example, 0 V) in the NAND flash memory 10.

Next, at a time t1, the row decoder module 19 applies the voltage VSGD to the selected select gate line SGD, and supplies the voltage VSS to the non-selected select gate line SGD. The voltage VSGD is a voltage higher than the voltage VSS. The sense amplifier module 21 continues to apply the voltage VDDSA to the non-selected bit line BL and continues to apply the voltage VSS to the selected bit line BL.

Next, at a time t2, the row decoder module 19 applies the following voltages to the selected word line WLn and the non-selected word lines WLn−3 to WLn+3. That is, a voltage VPASS1 is applied to the word lines WLn−3 and WLn−2, and a voltage VPASS4 is applied to the word line WLn−1. Additionally, a voltage VPASS3 is applied to the word lines WLn+1 and WLn+2, and a voltage VPASS2 is applied to the word line WLn+3. Furthermore, for example, the voltage VPASS3 is applied to the word line WLn. The voltage applied to the word line WLn may be one voltage among the voltages VPASS1 to VPASS4. Here, among the voltages of the word line WLn+1 and the word line WLn−1 adjacent to the word line WLn, the higher voltage is applied to the word line WLn.

When there is another word line WL between the word line WLn−3 and the select gate line SGS, as in the word line WLn−3, a voltage VPASS1 is applied to the other word line WL. Further, when there is another word line WL between the word line WLn+3 and the select gate line SGD, as in the word line WLn+3, a voltage VPASS2 is applied to the other word line WL.

Next, at a time t3, the row decoder module 19 applies a write voltage VPGM to the selected word line WLn. The voltages of the other non-selected word lines WL, the select gate lines SGD, and the bit lines BLs are maintained as the voltages applied at the time t2. The write voltage VPGM is a voltage for injecting electrons to the charge storage layer of the memory cell transistor MT as a write target. The write voltage VPGM is higher than any one voltage of the voltages VPASS1 to VPASS4.

By applying the write voltage VPGM, electrons are injected to the charge storage layer of the memory cell transistor MT which is a write target and is connected to the selected word line WLn, and thus writing is performed. Further, in the memory cell transistor MT which is not a write target and is connected to the selected word line WLn, a channel potential of the memory cell transistor is boosted, that is, the channel potential is increased, and thus charges are unlikely to be injected to the charge storage layer.

Next, at a time t4, the row decoder module 19 changes a voltage to be applied to the selected word line WLn from the write voltage VPGM to the voltage applied at the time t2 (i.e., the voltage VPASS3 in the present embodiment). The voltages of the other non-selected word lines WLs, the select gate lines SGD, and the bit lines BLs are maintained as the voltages applied at the time t2.

Next, at a time t5, the row decoder module 19 applies the voltage VSS to the selected word line WLn. The voltage VSS is also applied to the other non-selected word lines WL, the select gate lines SGD, and the bit lines BLs. Thereafter, at a time t6, the voltages of the word lines WL, the select gate lines SGD, and the bit lines BLs become the voltage VSS.

Figure 11:
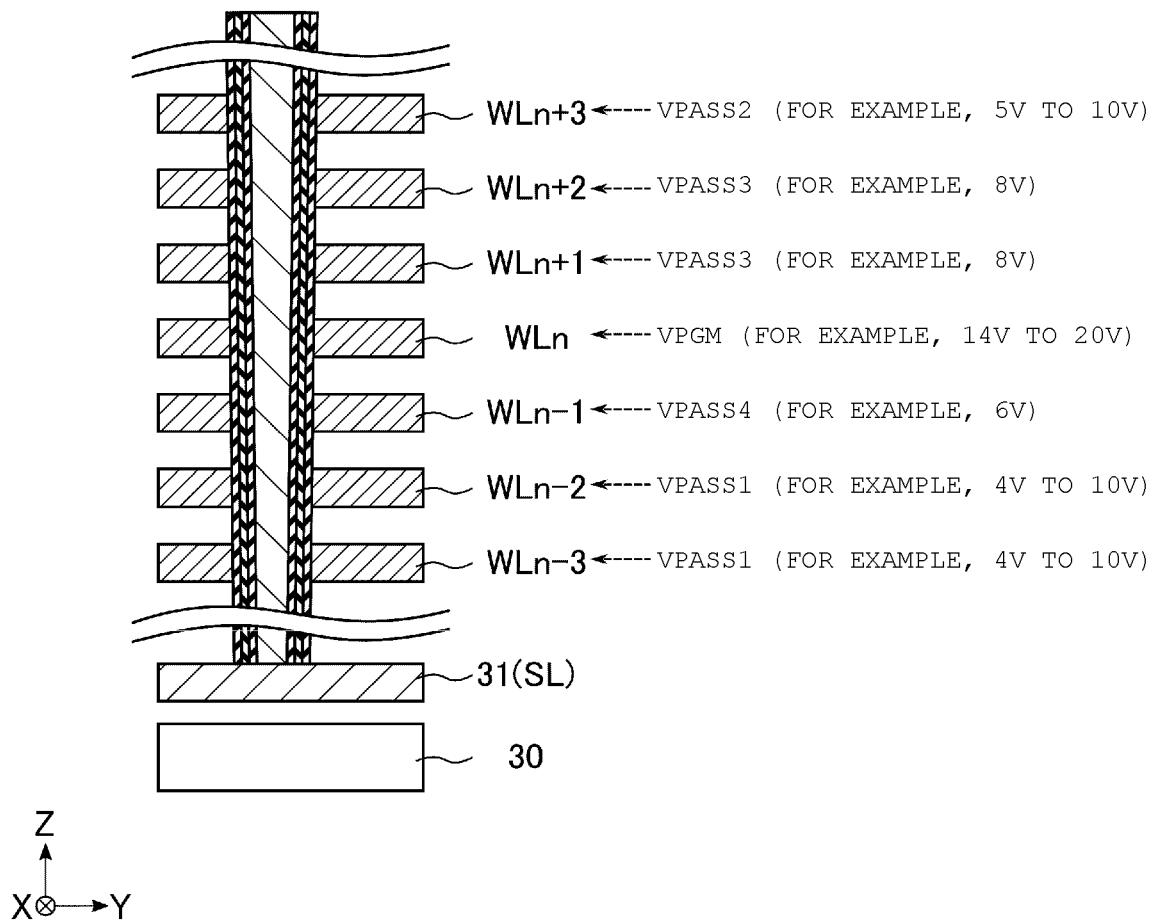
FIG. 11 is a diagram illustrating sections of the word lines and voltages applied to the word lines in the write operation.

FIG. 11 is a diagram illustrating sections of the word lines WLn−3 to WLn+3 and voltages applied to the word lines WLn−3 to WLn+3 in writing to the word lines WLn (i.e., between t3 and t4).

As described above, in writing to the word lines WLn, the write voltage VPGM (for example, 14V to 20V) is applied to the selected word line WLn. The voltage VPASS3 (for example, 8V) is applied to the non-selected word lines WLn+1 and WLn+2, and the voltage VPASS4 (for example, 6V) is applied to the non-selected word line WLn−1. Further, the voltage VPASS1 (for example, 4V to 10V) is applied to the non-selected word lines WLn−3 and WLn−2, and the voltage VPASS2 (for example, 5V to 10V) is applied to the non-selected word line WLn+3. Thereafter, when the write voltage VPGM is applied to the selected word line WLn as described above, the voltage VPASS3 is applied to the non-selected word lines WLn+1 and WLn+2. Writing when the voltage VPASS4 different from the voltage VPASS3 is applied to the non-selected word line WLn−1 is referred to as asymmetric writing.

The write voltage VPGM and the voltages VPASS1 and VPASS2 illustrated in FIG. 11 differ depending on the threshold voltages of the memory cell transistors MT in which data is to be written, that is, the states of the memory cell transistors MT among the A to G states.

FIGS. 12 to 18 are diagrams illustrating voltages applied to the word lines WLn−3 to WLn+3 in writing of data corresponding to each of the A to G states during a write operation.

Figure 12:
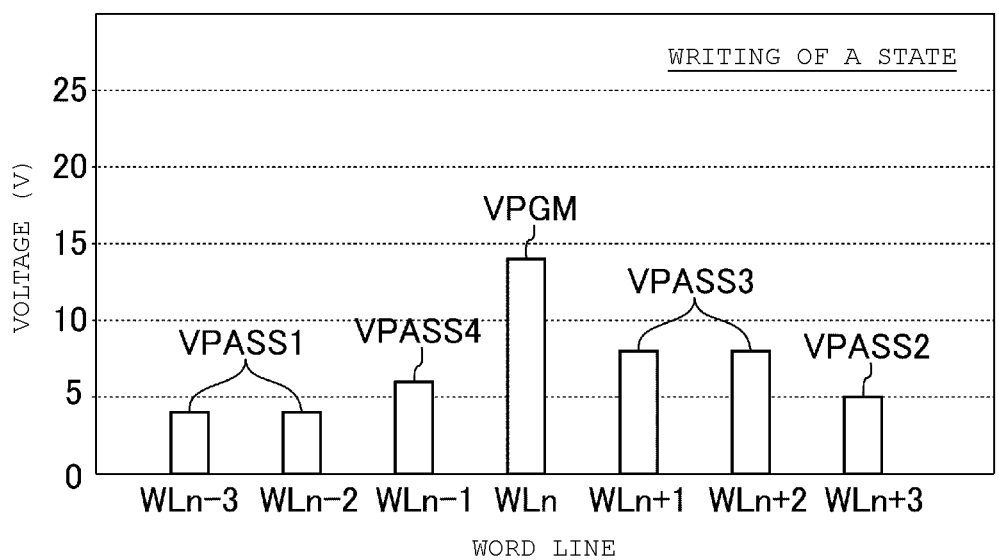
FIG. 12 is a diagram illustrating voltages applied to the word lines in writing of data corresponding to an A state during the write operation.

As illustrated in FIG. 12, when writing the data corresponding to the A state in the memory cell transistor MT connected to the word line WLn, the row decoder module 19 applies, for example, 14V as the write voltage VPGM to the word line WLn, 8V as the voltage VPASS3 to the word lines WLn+1 and WLn+2, and 6V as the voltage VPASS4 to the word line WLn−1. Further, the row decoder module 19 applies, for example, 4V as the voltage VPASS1 to the word lines WLn−3 and WLn−2, and 5V as the voltage VPASS2 to the word line WLn+3.

When writing the data corresponding to the A state, for example, a magnitude relationship between the voltages VPASS1 to VPASS4 is as follows. The voltage VPASS3 is lower than the write voltage VPGM, and is higher than the voltage VPASS4. The voltage VPASS4 is lower than the voltage VPASS3, and is higher than the voltages VPASS1 and VPASS2. The voltage VPASS2 is lower than the voltage VPASS4, and is higher than the voltage VPASS1. The voltage VPASS1 is lower than the voltage VPASS2.

Figure 13:
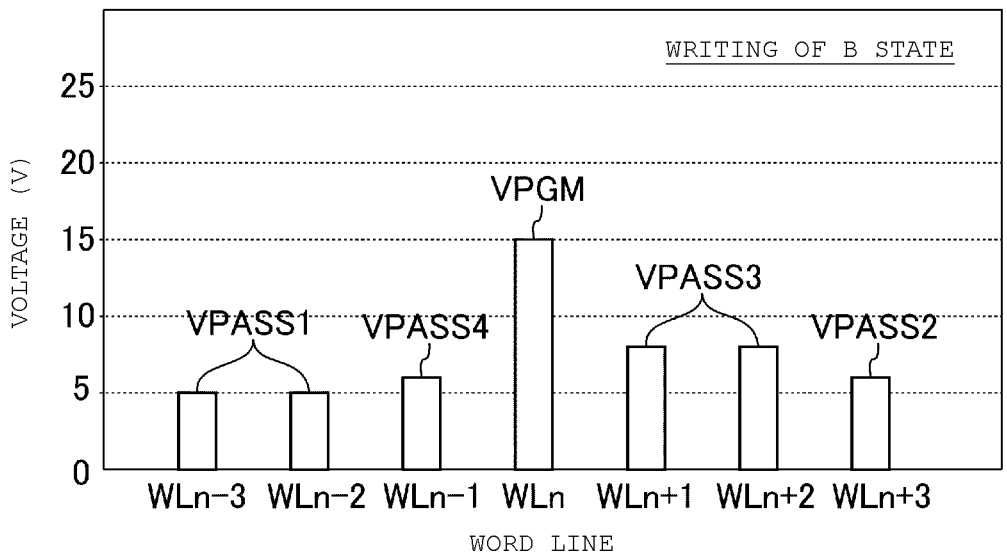
FIG. 13 is a diagram illustrating voltages applied to the word lines in writing of data corresponding to a B state during the write operation.

As illustrated in FIG. 13, when writing the data corresponding to the B state in the memory cell transistor MT connected to the word line WLn, the row decoder module 19 applies, for example, 15V as the write voltage VPGM to the word line WLn, 8V as the voltage VPASS3 to the word lines WLn+1 and WLn+2, and 6V as the voltage VPASS4 to the word line WLn−1. Further, the row decoder module 19 applies, for example, 5V as the voltage VPASS1 to the word lines WLn−3 and WLn−2, and 6V as the voltage VPASS2 to the word line WLn+3.

When writing the data corresponding to the B state, for example, a magnitude relationship between the voltages VPASS1 to VPASS4 is as illustrated in FIG. 13.

Figure 14:
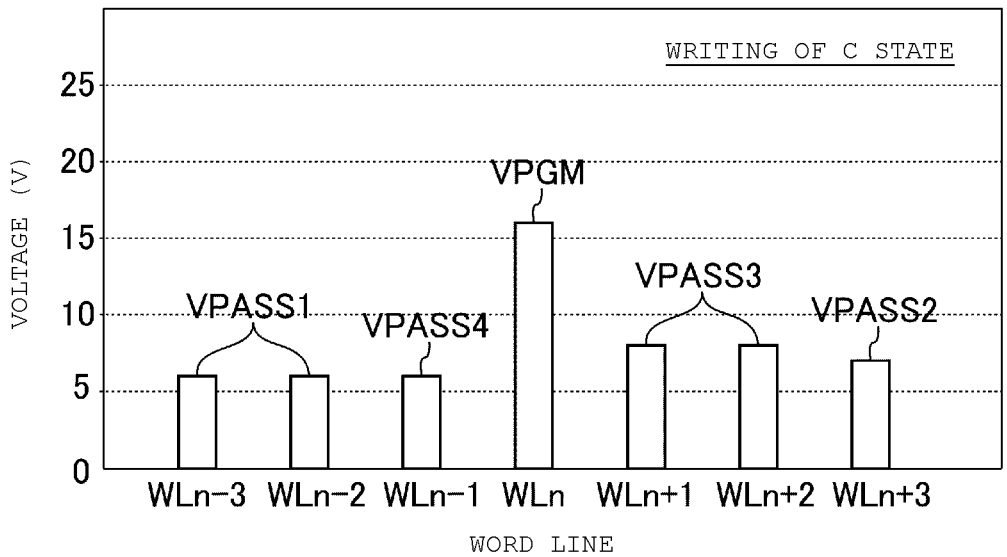
FIG. 14 is a diagram illustrating voltages applied to the word lines in writing of data corresponding to a C state during the write operation.

As illustrated in FIG. 14, when writing the data corresponding to the C state in the memory cell transistor MT connected to the word line WLn, the row decoder module 19 applies, for example, 16V as the write voltage VPGM to the word line WLn, 8V as the voltage VPASS3 to the word lines WLn+1 and WLn+2, and 6V as the voltage VPASS4 to the word line WLn−1. Further, the row decoder module 19 applies, for example, 6V as the voltage VPASS1 to the word lines WLn−3 and WLn−2, and 7V as the voltage VPASS2 to the word line WLn+3.

When writing the data corresponding to the C state, for example, a magnitude relationship between the voltages VPASS1 to VPASS4 is as illustrated in FIG. 14.

Figure 15:
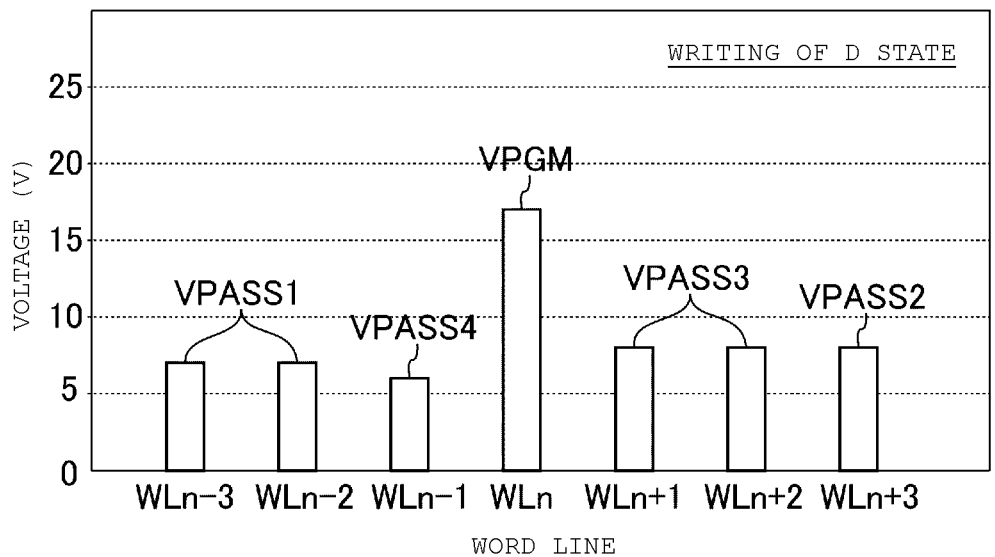
FIG. 15 is a diagram illustrating voltages applied to the word lines in writing of data corresponding to a D state during the write operation.

As illustrated in FIG. 15, when writing the data corresponding to the D state in the memory cell transistor MT connected to the word line WLn, the row decoder module 19 applies, for example, 17V as the write voltage VPGM to the word line WLn, 8V as the voltage VPASS3 to the word lines WLn+1 and WLn+2, and 6V as the voltage VPASS4 to the word line WLn−1. Further, the row decoder module 19 applies, for example, 7V as the voltage VPASS1 to the word lines WLn−3 and WLn−2, and 8V as the voltage VPASS2 to the word line WLn+3.

When writing the data corresponding to the D state, for example, a magnitude relationship between the voltages VPASS1 to VPASS4 is as follows. The voltage VPASS3 is lower than the write voltage VPGM, is higher than the voltage VPASS4, and is substantially the same as the voltage VPASS2. The voltage VPASS4 is lower than the voltages VPASS3, VPASS2, and VPASS1. The voltage VPASS2 is substantially the same as the voltage VPASS3, and is higher than the voltages VPASS4 and VPASS1. The voltage VPASS1 is lower than the voltages VPASS3 and VPASS2, and is higher than the voltage VPASS4.

Figure 16:
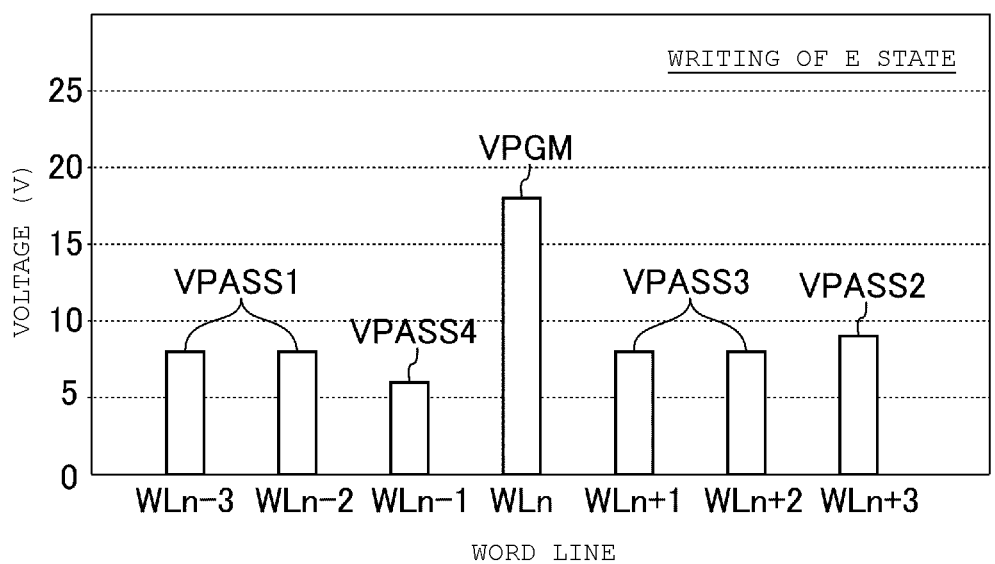
FIG. 16 is a diagram illustrating voltages applied to the word lines in writing of data corresponding to an E state during the write operation.

As illustrated in FIG. 16, when writing the data corresponding to the E state in the memory cell transistor MT connected to the word line WLn, the row decoder module 19 applies, for example, 18V as the write voltage VPGM to the word line WLn, 8V as the voltage VPASS3 to the word lines WLn+1 and WLn+2, and 6V as the voltage VPASS4 to the word line WLn−1. Further, the row decoder module 19 applies, for example, 8V as the voltage VPASS1 to the word lines WLn−3 and WLn−2, and 9V as the voltage VPASS2 to the word line WLn+3.

When writing the data corresponding to the E state, for example, a magnitude relationship between the voltages VPASS1 to VPASS4 is as follows. The voltage VPASS3 is lower than the write voltage VPGM, and is higher than the voltage VPASS4. The voltage VPASS4 is lower than the voltages VPASS3, VPASS2, and VPASS1. The voltage VPASS2 is higher than the voltages VPASS3, VPASS4, and VPASS1. The voltage VPASS1 is lower than the voltage VPASS2, and is higher than the voltage VPASS4.

Figure 17:
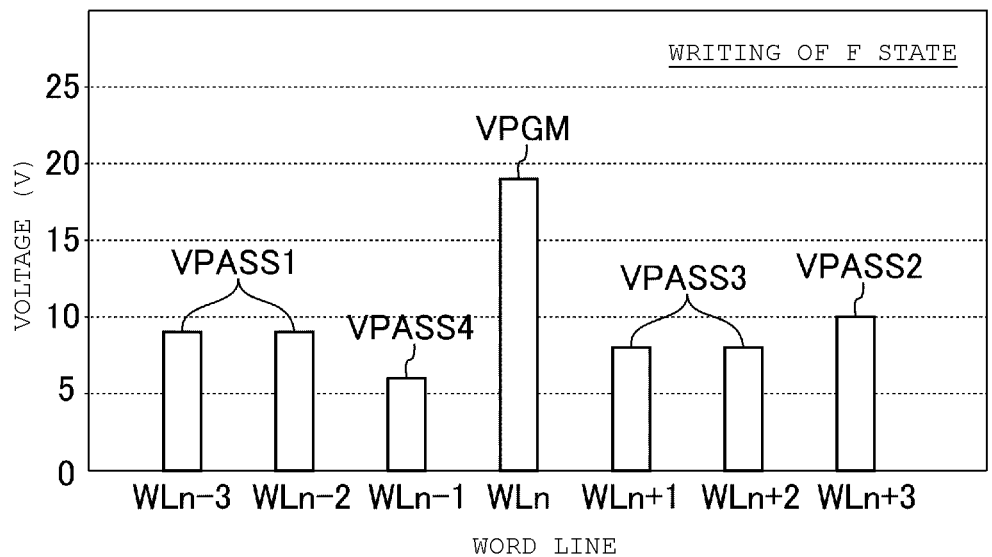
FIG. 17 is a diagram illustrating voltages applied to the word lines in writing of data corresponding to an F state during the write operation.

As illustrated in FIG. 17, when writing the data corresponding to the F state in the memory cell transistor MT connected to the word line WLn, the row decoder module 19 applies, for example, 19V as the write voltage VPGM to the word line WLn, 8V as the voltage VPASS3 to the word lines WLn+1 and WLn+2, and 6V as the voltage VPASS4 to the word line WLn−1. Further, the row decoder module 19 applies, for example, 9V as the voltage VPASS1 to the word lines WLn−3 and WLn−2, and 10V as the voltage VPASS2 to the word line WLn+3.

When writing the data corresponding to the F state, for example, a magnitude relationship between the voltages VPASS1 to VPASS4 is as illustrated in FIG. 17.

Figure 18:
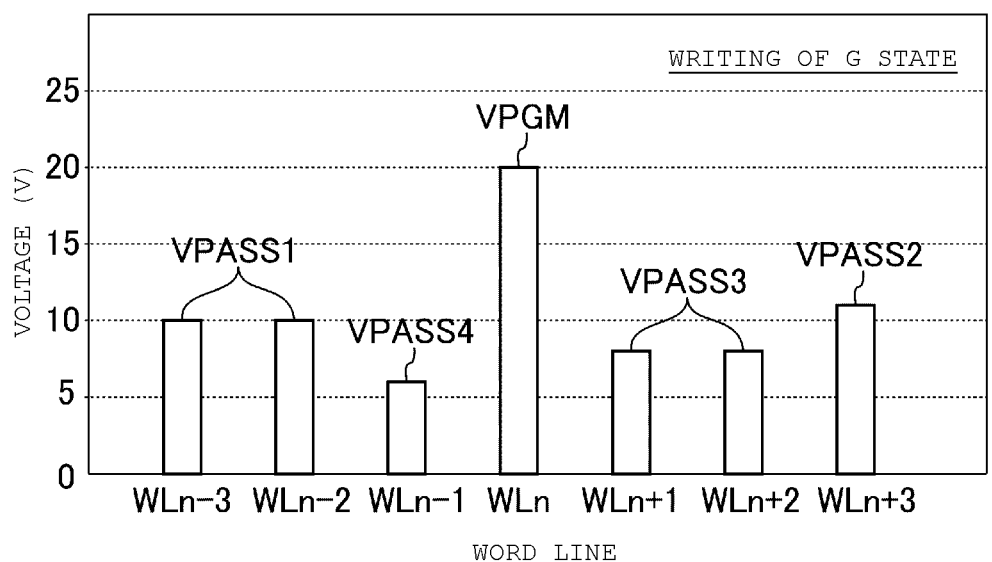
FIG. 18 is a diagram illustrating voltages applied to the word lines in writing of data corresponding to a G state during the write operation.

As illustrated in FIG. 18, when writing the data corresponding to the G state in the memory cell transistor MT connected to the word line WLn, the row decoder module 19 applies, for example, 20V as the write voltage VPGM to the word line WLn, 8V as the voltage VPASS3 to the word lines WLn+1 and WLn+2, and 6V as the voltage VPASS4 to the word line WLn−1. Further, the row decoder module 19 applies, for example, 10V as the voltage VPASS1 to the word lines WLn−3 and WLn−2, and 11V as the voltage VPASS2 to the word line WLn+3.

When writing the data corresponding to the G state, for example, a magnitude relationship between the voltages VPASS1 to VPASS4 is as follows. The voltage VPASS3 is lower than the write voltage VPGM, and is higher than the voltage VPASS4. The voltage VPASS4 is lower than the voltages VPASS3, VPASS2, and VPASS1. The voltage VPASS2 is higher than the voltages VPASS3, VPASS4, and VPASS1. The voltage VPASS1 is lower than the voltage VPASS2, and is higher than the voltage VPASS3 and the voltage VPASS4.

In the above-described write operation, although the voltage VPASS3 is applied to two word lines WLn+1 and WLn+2, the present disclosure is not limited thereto. For example, the voltage VPASS3 may be applied to three word lines WLn+1 to WLn+3 or four or more word lines.

Next, in writing to the word lines WL0 to WL7, voltages applied to the word lines WL0 to WL7, the dummy word lines WLDS0, WLDS1, WLDD0, and WLDD1, and the select gate lines SGD and SGS will be described with reference to FIG. 19.

FIG. 19 is a diagram illustrating voltages applied to the word lines WL0 to WL7, the dummy word lines WLDS0, WLDS1, WLDD0, and WLDD1, and the select gate lines SGD and SGS in the write operation. FIG. 19 illustrates a case where the data corresponding to the A state is written in the memory cell transistor MT connected to each of the word lines WL0 to WL7.

In writing to the selected word line WL0, the write voltage VPGM (for example, 14V) is applied to the word line WL0. A voltage VPASS3 (for example, 8V) is applied to each of the word lines WL1 and WL2, and a voltage VPASS5 (for example, 6V) is applied to the dummy word line WLDS1.

A voltage VPASS4 (for example, 6V) is applied to the dummy word line WLDS0. A voltage VPASS2 (for example, 5V) is applied to each of the word lines WL3 to WL7. A voltage VPASS5 (for example, 6V) is applied to the dummy word line WLDD1, and a voltage VPASS6 (for example, 3.4V) is applied to the dummy word line WLDD0. Further, a voltage VSGS (for example, 0V) is applied to the select gate line SGS, and a voltage VSGD (for example, 3V) is applied to the select gate line SGD.

In writing to the word line WL0, the dummy word line WLDS1 corresponds to the word line WLn−1, and thus the voltage applied to the dummy word line WLDS1 is not the voltage VPASS4 but the voltage VPASS5.

Further, in writing to the selected word line WL1, the write voltage VPGM (for example, 14V) is applied to the word line WL1. A voltage VPASS3 (for example, 8V) is applied to each of the word lines WL2 and WL3, and a voltage VPASS4 (for example, 6V) is applied to the word line WL0.

A voltage VPASS5 (for example, 6V) is applied to the dummy word line WLDS1, and a voltage VPASS4 (for example, 6V) is applied to the dummy word line WLDS0. A voltage VPASS2 (for example, 5V) is applied to each of the word lines WL4 to WL7. A voltage VPASS5 (for example, 6V) is applied to the dummy word line WLDD1, and a voltage VPASS6 (for example, 3.4V) is applied to the dummy word line WLDD0. Further, a voltage VSGS (for example, 0V) is applied to the select gate line SGS, and a voltage VSGD (for example, 3V) is applied to the select gate line SGD.

In writing to the selected word lines WL2 to WL5, the applied voltages are as illustrated in FIG. 19.

Further, in writing to the selected word line WL6, the write voltage VPGM (for example, 14V) is applied to the word line WL6. A voltage VPASS3 (for example, 8V) is applied to the word line WL7, and a voltage VPASS5 (for example, 6V) is applied to the dummy word line WLDD1. A voltage VPASS4 (for example, 6V) is applied to the word line WL5.

A voltage VPASS6 (for example, 3.4V) is applied to the dummy word line WLDD0. A voltage VPASS1 (for example, 4V) is applied to each of the word lines WL0 to WL4. A voltage VPASS5 (for example, 6V) is applied to the dummy word line WLDS1, and a voltage VPASS6 (for example, 3.4V) is applied to the dummy word line WLDS0. Further, a voltage VSGS (for example, 0V) is applied to the select gate line SGS, and a voltage VSGD (for example, 3.0V) is applied to the select gate line SGD.

In the writing to the word line WL6, the dummy word line WLDD1 corresponds to the word line WLn+2, and thus the voltage applied to the dummy word line WLDD1 is not the voltage VPASS3 but the voltage VPASS5.

Further, in writing to the selected word line WL7, the write voltage VPGM (for example, 14V) is applied to the word line WL7. A voltage VPASS5 (for example, 6V) is applied to the dummy word line WLDD1, and a voltage VPASS6 (for example, 3.4V) is applied to the dummy word line WLDD0. A voltage VPASS4 (for example, 6V) is applied to the word line WL6.

A voltage VPASS1 (for example, 4V) is applied to each of the word lines WL0 to WL5. A voltage VPASS5 (for example, 6V) is applied to the dummy word line WLDS1, and a voltage VPASS6 (for example, 3.4V) is applied to the dummy word line WLDS0. Further, a voltage VSGS (for example, 0V) is applied to the select gate line SGS, and a voltage VSGD (for example, 3.0V) is applied to the select gate line SGD.

In the writing to the word line WL7, the dummy word lines WLDD1 and WLDD0 correspond to the word lines WLn+1 and WLn+2, and thus the voltages applied to the dummy word lines WLDD1 and WLDD0 are not the voltage VPASS3 but the voltages VPASS5 and VPASS6.

1.3 Write Operation According to First Modification Example

Next, a write operation according to a first modification example will be described. In the write operation according to the first embodiment illustrated in FIG. 9, asymmetric writing to all the word lines WL0 to WL7 is subsequently executed. On the other hand, in the first modification example, symmetric writing to the word line WL0 closest to the source line SL or the select gate line SGS is executed, and asymmetric writing to the other word lines WL1 to WL7 is executed.

As illustrated in FIGS. 11 and 12, the asymmetric writing is writing in which different voltages are applied to the word lines WLn+1 and WLn+2 and the word line WLn−1 which are adjacent to the selected word line WLn. The symmetric writing is writing in which the same voltage is applied to the word line WLn+1 and the word line WLn−1 which are adjacent to the selected word line WLn. Details of the symmetric writing will be described below.

Figure 20:
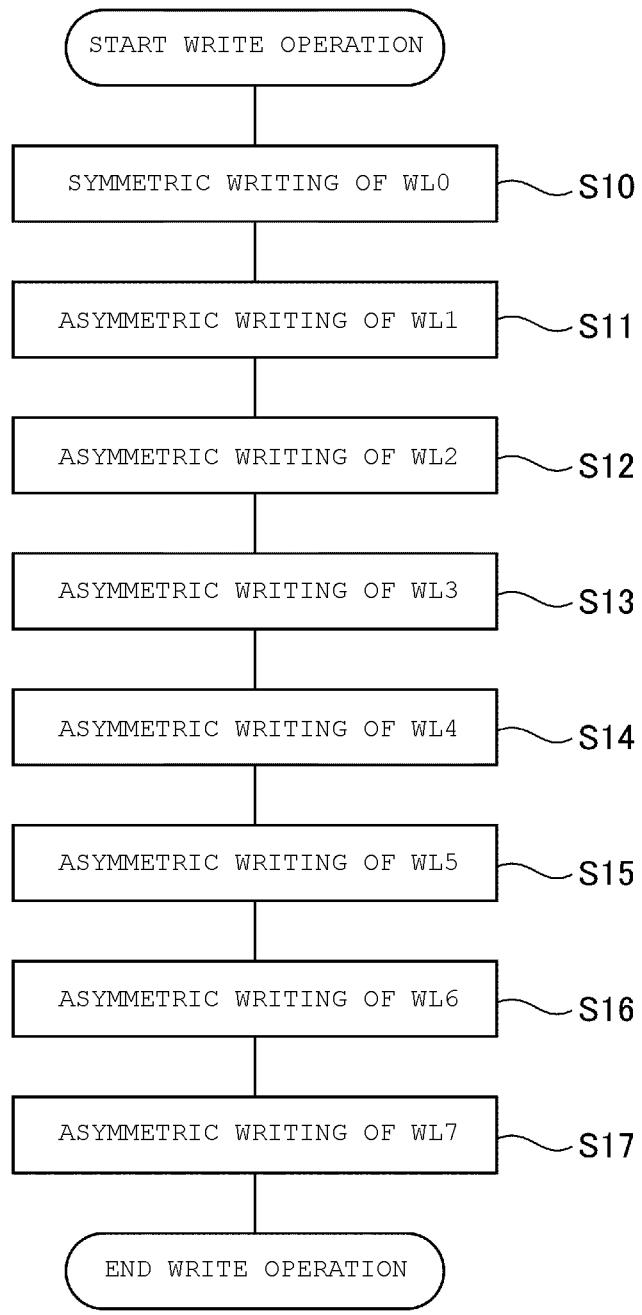
FIG. 20 is a flowchart illustrating a write operation according to a first modification example of the first embodiment.

First, a flow of a write operation according to the first modification example will be described with reference to FIG. 20. FIG. 20 is a flowchart illustrating a write operation according to the first modification example. In the first modification example, symmetric writing to the word line WL0 (step S10) is executed, and subsequently, asymmetric writing to the word lines WL1 to WL7 (steps S11 to S17) is executed in order.

Next, in writing to the word lines WL0 to WL7 according to the first modification example, the voltages applied to the word lines, the dummy word lines, and the select gate lines will be described with reference to FIG. 21. FIG. 21 is a diagram illustrating voltages applied to the word lines WL0 to WL7, the dummy word lines WLDS0, WLDS1, WLDD0, and WLDD1, and the select gate lines SGD and SGS according to the first modification example. FIG. 21 illustrates a case where the data corresponding to the A state is written in the memory cell transistor MT connected to each of the word lines WL0 to WL7.

In writing to the selected word line WL0, symmetric writing is executed. A write voltage VPGM (for example, 14V) is applied to the word line WL0. A voltage VPASS7 (for example, 10V) is applied to the dummy word line WLDS1 and the word line WL1.

A voltage VPASS4 (for example, 6V) is applied to the dummy word line WLDS0, and a voltage VPASS2 (for example, 5V) is applied to the word lines WL2 to WL7. A voltage VPASS5 (for example, 6V) is applied to the dummy word line WLDD1, and a voltage VPASS6 (for example, 3.4V) is applied to the dummy word line WLDD0. Further, a voltage VSGS (for example, 0V) is applied to the select gate line SGS, and a voltage VSGD (for example, 3.0V) is applied to the select gate line SGD.

In writing to the selected word lines WL1 to WL7, the applied voltages are the same as the voltages illustrated in FIG. 19.

Figure 22:
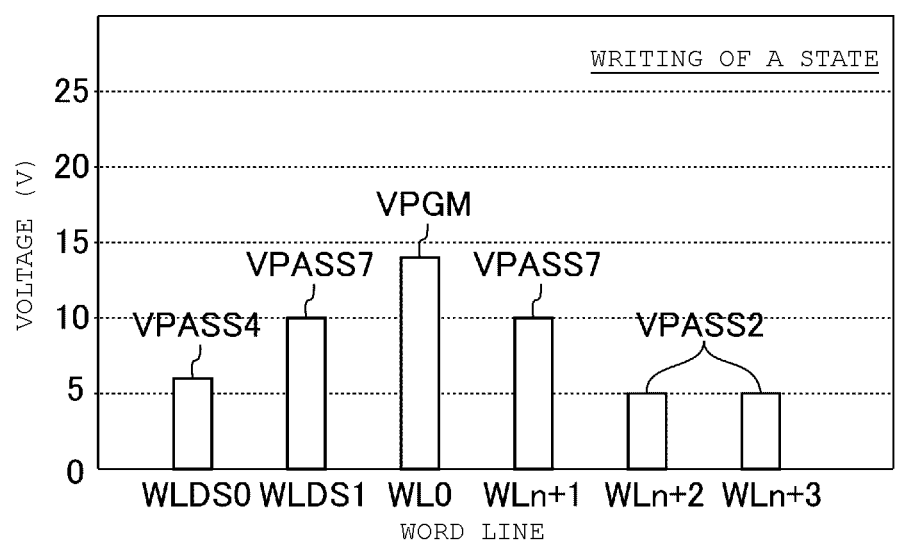
FIG. 22 is a diagram illustrating voltages applied to word lines and dummy word lines in symmetric writing.

Next, symmetric writing to the word line WL0 will be described with reference to FIG. 22. FIG. 22 is a diagram illustrating voltages applied to the word lines WL0 to WLn+3 and the dummy word lines WLDS0 and WLDS1 when writing data corresponding to the A state in symmetric writing.

In symmetric writing, when writing data corresponding to the A state in the memory cell transistor MT connected to the word line WL0, a write voltage VPGM (for example, 14V) is applied to the word line WL0. The same voltage VPASS7 (for example, 8V) is applied to the dummy word line WLDS1 and the word line WLn+1 which are adjacent to the word line WL0. Further, a voltage VPASS4 (for example, 6V) is applied to the dummy word line WLDS0, and a voltage VPASS2 (for example, 5V) is applied to each of the word lines WLn+2 and WLn+3.

The first modification example is different from the first embodiment in that writing to the selected word line WL0 is not asymmetric writing but symmetric writing.

1.4 Write Operation According to Second Modification Example

Next, a write operation according to a second modification example will be described. In the second modification example, symmetric writing to the word line WL0 and the word line WL7 is executed, and asymmetric writing to the other word lines WL1 to WL6 is executed, the word line WL0 being closest to the source line SL or the select gate line SGS, and the word line WL7 being closest to the bit line BL or the select gate line SGD.

First, a flow of a write operation according to the second modification example will be described with reference to FIG. 23. FIG. 23 is a flowchart illustrating a write operation according to the second modification example. In the second modification example, symmetric writing to the word line WL0 (step S20) is executed, subsequently, asymmetric writing to the word lines WL1 to WL6 (steps S21 to S26) is executed in order, and symmetric writing to the word line WL7 (step S27) is executed.

Next, in writing to the word lines WL0 to WL7 according to the second modification example, the voltages applied to the word lines, the dummy word lines, and the select gate lines will be described with reference to FIG. 24. FIG. 24 is a diagram illustrating voltages applied to the word lines WL0 to WL7, the dummy word lines WLDS0, WLDS1, WLDD0, and WLDD1, and the select gate lines SGD and SGS according to the second modification example. Similar to FIG. 21, FIG. 24 also illustrates a case where the data corresponding to the A state is written in the memory cell transistor MT connected to each of the word lines WL0 to WL7.

Similar to the first modification example, in writing to the selected word line WL0, symmetric writing is executed, and in writing to the selected word lines WL1 to WL6, asymmetric writing is executed.

In writing to the selected word line WL7, symmetric writing is executed. A write voltage VPGM (for example, 14V) is applied to the word line WL7. A voltage VPASS7 (for example, 10V) is applied to the word line WL6 and the dummy word line WLDD1.

A voltage VPASS1 (for example, 4V) is applied to the word lines WL0 to WL5. A voltage VPASS5 (for example, 6V) is applied to the dummy word line WLDS1, and a voltage VPASS6 (for example, 3.4V) is applied to the dummy word line WLDS0. A voltage VPASS2 (for example, 5V) is applied to the dummy word line WLDD0, a voltage VSGS (for example, 0V) is applied to the select gate line SGS, and a voltage VSGD (for example, 3V) is applied to the select gate line SGD.

The second modification example is different from the first embodiment in that writing to the selected word lines WL0 and WL7 is not asymmetric writing but symmetric writing.

1.5 Effects According to First Embodiment

According to the first embodiment and the first and second modification examples, it is possible to provide a semiconductor memory device capable of improving reliability of a write operation.

Figure 25:
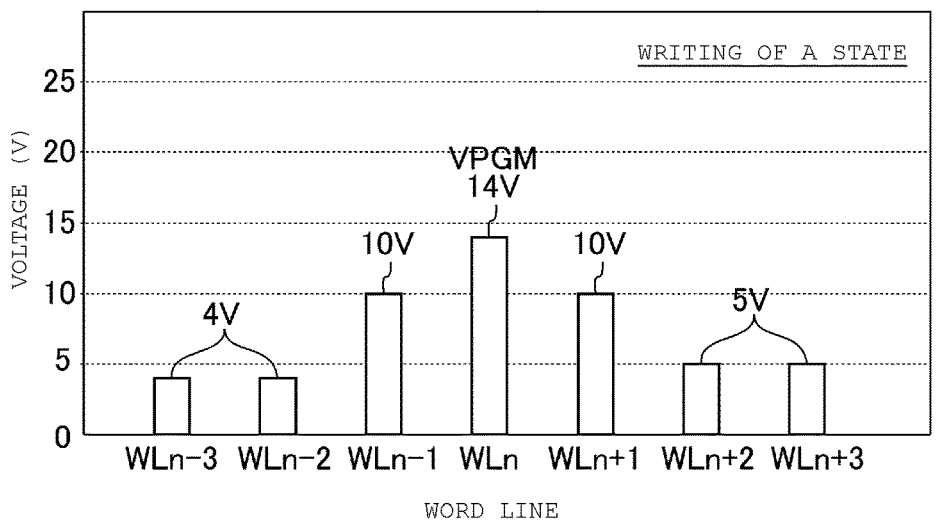
FIG. 25 is a diagram illustrating voltages applied to word lines in a write operation according to a comparative example 1.
Figure 26:
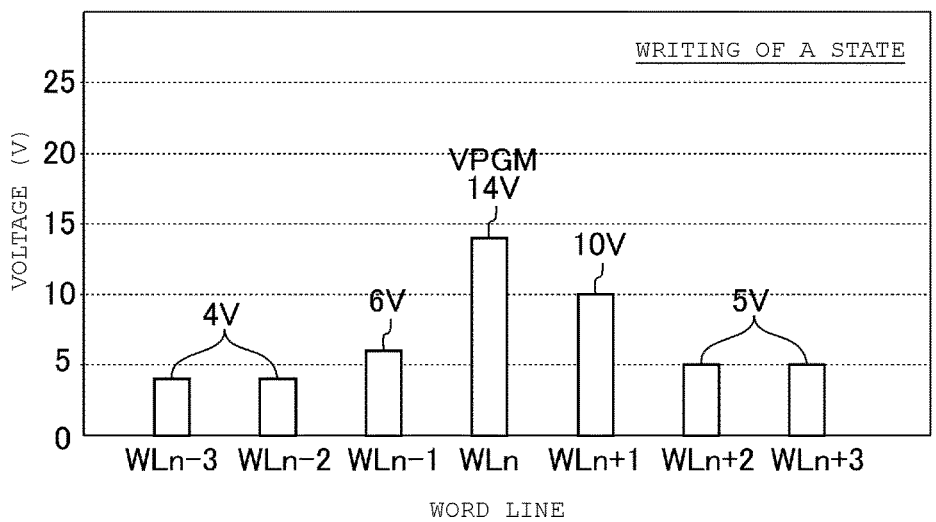
FIG. 26 is a diagram illustrating voltages applied to word lines in a write operation according to a comparative example 2.
Figure 27:
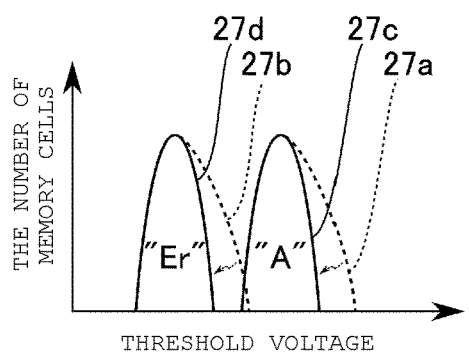
FIG. 27 is a diagram illustrating threshold voltage distributions of the memory cell transistors according to the first embodiment, the modification examples, and the comparative examples.

Hereinafter, comparative examples 1 and 2 related to the first embodiment and the modification examples will be described, and then effects according to the first embodiment and the modification examples will be described. FIG. 25 illustrates voltages applied to the word lines WLs in a write operation according to a comparative example 1, and FIG. 26 illustrates voltages applied to the word lines WLs in a write operation according to a comparative example 2. FIG. 27 illustrates threshold voltage distributions of the memory cell transistors according to the first embodiment, the modification examples, and the comparative examples 1 and 2.

In the comparative example 1, as illustrated in FIG. 25, in an operation of writing data corresponding to the A state in the memory cell transistor connected to the word line WLn, a write voltage VPGM (for example, 14V) is applied to the word line WLn as a write target. Further, 10V is applied to the word lines WLn−1 and WLn+1, 4V is applied to the word lines WLn−3 and WLn−2, and 5V is applied to the word lines WLn+2 and WLn+3. In such a write operation, as illustrated in FIG. 27 by a broken line 27a, the base of the threshold voltage distribution of the memory cell transistors MT may be expanded due to a neighboring word line interference effect.

In the comparative example 2, as illustrated in FIG. 26, in an operation of writing data corresponding to the A state in the memory cell transistor connected to the word line WLn, a write voltage VPGM (for example, 14V) is applied to the word line WLn as a write target. Further, 6V is applied to the word line WLn−1, 10V is applied to the word line WLn+1, 4V is applied to the word lines WLn−3 and WLn−2, and 5V is applied to the word lines WLn+2 and WLn+3. In such a write operation, boosting efficiency in the channel of the memory cell transistor MT as a non-write target decreases, that is, a channel potential of the memory cell transistor MT as a non-write target decreases, the channel potential being a voltage which increases by boosting using the word line voltage. For this reason, as illustrated in FIG. 27 by a broken line 27b, the threshold voltage distribution of the memory cell transistor in the Er state approaches the threshold voltage distribution of the memory cell transistor in the A state (hereinafter, deterioration of the threshold voltage distribution in the Er state).

On the other hand, in the first embodiment and the first and second modification examples, in writing to the word line WLn, a write voltage VPGM (for example, 14V) is applied to the word line WLn connected to the memory cell transistor as a write target. Further, a voltage VPASS4 is applied to the word line WLn−1, and a voltage VPASS3 higher than the voltage VPASS4 is applied to the word lines WLn+1 and WLn+2.

More specifically, in the comparative examples 1 and 2, 10V is applied to the word line WLn+1. On the other hand, in the first embodiment and the first and second modification examples, a voltage VPASS3 (for example, 8V) lower than 10V, which is applied in the comparative examples 1 and 2, is applied to the two word lines WLn+1 and WLn+2. In this manner, by applying the voltage VPASS3 (8V) lower than 10V, which is applied in the comparative examples 1 and 2, to the two word lines WLn+1 and WLn+2, boosting efficiency is increased by the voltage VPASS3 applied to the word lines WLn+1 and WLn+2, and thus the channel potential of the memory cell transistor MT is increased as compared with the comparative examples 1 and 2. Thereby, as illustrated in FIG. 27 by a solid line 27d, deterioration of the threshold voltage distribution in the Er state can be prevented.

Further, in the comparative example 1, 10V is applied to the word line WLn−1. On the other hand, in the first embodiment and the first and second modification examples, a voltage VPASS4 (for example, 6V) lower than 10V, which is applied in the comparative example 1, is applied to the word line WLn−1. As described above, by applying the voltage VPASS4 (6V) lower than 10V applied in the comparative example 1 to the word line WLn−1, as illustrated in FIG. 27 by a solid line 27c, expansion of the base of the threshold voltage distribution of the memory cell transistor MT due to the neighboring word line interference effect can be prevented.

Further, in the first embodiment and the first and second modification examples, since only the voltages VPASS4 and VPASS3 applied to the word lines WLn−1, WLn+1, and WLn+2 are increased or decreased, a speed in write operation is not reduced.

As described above, in the first embodiment and the first and second modification examples, it is possible to prevent expansion of the base of the threshold voltage distribution of the memory cell transistor MT, and prevent the phenomenon that the threshold voltage distribution of the memory cell transistor MT in the Er state approaches the threshold voltage distribution of the memory cell transistor MT in the A state. Thereby, in the first embodiment, it is possible to improve reliability of the write operation.

Further, in the first modification example, symmetric writing to the word line WL closest to the source line SL is performed, and asymmetric writing to the other word lines WLs is performed. Thereby, it is possible to improve boosting efficiency in the channel of the memory cell transistor MT in writing to the word line WL0, and prevent write disturbance occurring when writing.

In the second modification example, symmetric writing to the word line WL0 closest to the source line SL and the word line WL7 closest to the bit line BL is performed, and asymmetric writing to the other word lines WLs is performed. Thereby, it is possible to improve boosting efficiency in the channel of the memory cell transistor MT in writing to the word lines WL0 and WL7, and prevent write disturbance occurring when writing.

2. Second Embodiment

Next, a semiconductor memory device according to a second embodiment will be described. The semiconductor memory device according to the second embodiment has a structure in which stacked bodies obtained by stacking the plurality of word lines are disposed in two stages (i.e., upper and lower stages) on a substrate. Other configurations are the same as those of the first embodiment. In the second embodiment, differences from the first embodiment will be mainly described.

Figure 28:
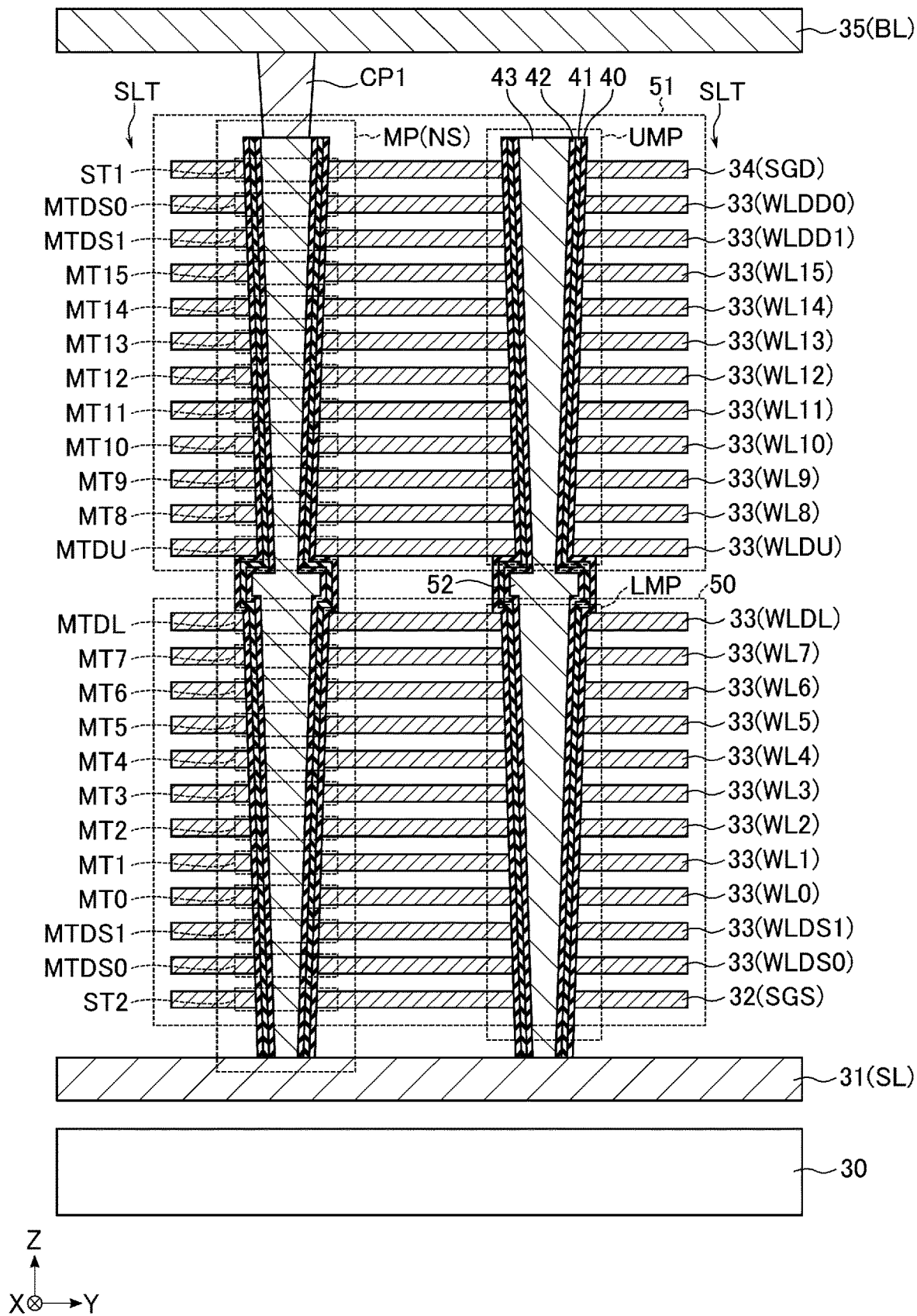
FIG. 28 is a sectional view of memory cell transistors in a memory cell array according to a second embodiment.

First, a sectional structure of the memory cell transistors of the memory cell array 11 according to the second embodiment will be described with reference to FIG. 28. FIG. 28 is a sectional view of the memory cell transistors of the memory cell array 11. In FIG. 28, interlayer insulating films between conductive layers are omitted.

The memory cell array 11 includes a lower stacked body 50 provided on the semiconductor substrate 30 and an upper stacked body 51 provided on the stacked body 50. The stacked body 50 includes a plurality of conductive layers 32 and 33 and a plurality of lower memory pillars LMPs. The stacked body 51 includes a plurality of conductive layers 33 and 34 and a plurality of upper memory pillars UMPs. A bonding layer 52 is provided between the lower memory pillar LMP and the upper memory pillar UMP. The bonding layer 52 electrically connects the lower memory pillar LMP and the upper memory pillar UMP. The bonding layer 52 includes, for example, a semiconductor layer. In one memory pillar MP, the lower memory pillar LMP, the bonding layer 52, and the upper memory pillar UMP are provided.

Specifically, referring to FIG. 28, a conductive layer 31 is provided above the semiconductor substrate 30. The conductive layer 31 is formed in a flat plate shape parallel to the XY plane, and functions as the source line SL. The main surface of the semiconductor substrate 30 corresponds to the XY plane.

A plurality of slits SLT along an XZ plane are arranged on the conductive layer 31 in the Y direction. An assembly of the stacked body or the structure body 50, the stacked body 51, and the bonding layer 52 between the adjacent slits SLT on the conductive layer 31 corresponds to, for example, one string unit SU.

The conductive layer 32, the plurality of conductive layers 33, the bonding layer 52, the conductive layer 34, and the conductive layer 35 are provided in this order from the lowest layer between adjacent slits SLT on the conductive layer 31. Among these conductive layers, conductive layers adjacent in the Z direction are stacked via interlayer insulating films. Each of the conductive layers 32 to 34 is formed in a flat plate shape parallel to the XY plane.

The conductive layer 32 functions as the select gate line SGS. The plurality of conductive layers 33 respectively function as the dummy word lines WLDS0 and WLDS1, the word lines WL0 to WL7, the dummy word lines WLDL and WLDU, the word lines WL8 to WL15, and the dummy word lines WLDD1 and WLDD0, in order from the lowest layer. The conductive layer 34 functions as the select gate line SGD.

A plurality of memory pillars MPs are arranged, for example, in a staggered manner in the X direction and the Y direction. Each of the plurality of memory pillars MPs extends or penetrates through the stacked bodies 50 and 51 between the slits SLT in the Z direction. Each of the memory pillars MPs is provided through the conductive layers 34, 33, and 32 so as to reach an upper surface of the conductive layer 31 from an upper surface of the conductive layer 34. Each of the memory pillars MP functions as one NAND string NS.

The memory pillar MP includes, for example, a block insulating layer 40, a charge storage layer 41, a tunnel insulating layer (also referred to as a tunnel insulating film) 42, and a semiconductor layer 43. Specifically, the block insulating layer 40 is provided on an inner wall of a memory hole for forming the memory pillar MP. The charge storage layer 41 is provided on an inner wall of the block insulating layer 40. The tunnel insulating layer 42 is provided on an inner wall of the charge storage layer 41. Further, the semiconductor layer 43 is provided inside the tunnel insulating layer 42. The memory pillar MP may have a structure in which a core insulating layer is provided inside the semiconductor layer 43.

A contact plug CP1 is provided on each memory pillar MP. Further, the conductive layer 35 is provided on the contact plug CP1. The conductive layer 35 functions as the bit line BL. The conductive layer 35 is electrically connected to the semiconductor layer 43 of the memory pillar MP via the contact plug CP1.

Figure 29:
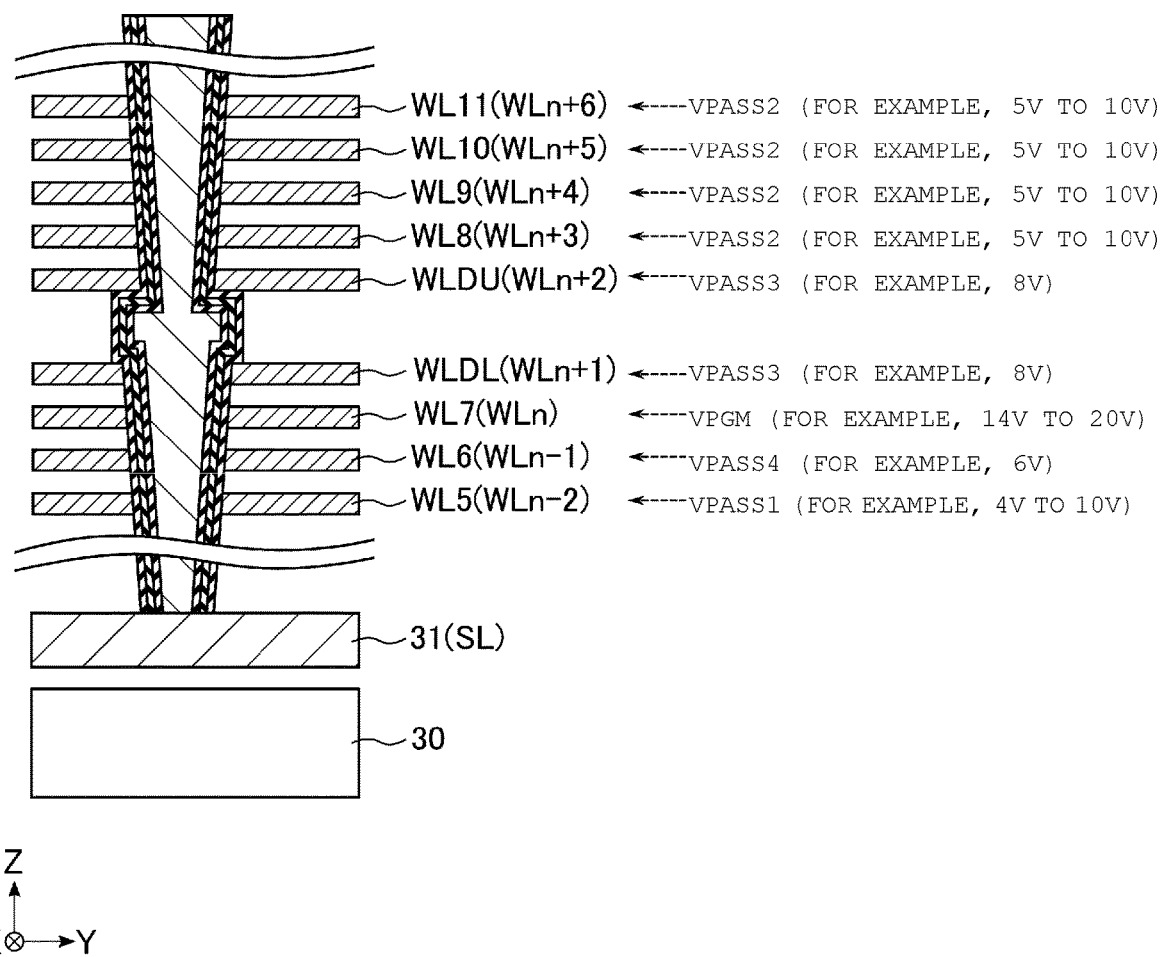
FIG. 29 is a diagram illustrating sections of word lines and voltages applied to the word lines in the write operation according to the second embodiment.

Next, an example of a write operation according to the second embodiment will be described with reference to FIG. 29 and FIG. 30. FIG. 29 is a diagram illustrating voltages applied to the word lines WL5 to WL11 in writing to the word line WL7 (WLn). FIG. 29 illustrates a case where the data corresponding to the A state is written in the memory cell transistor MT connected to the word line WL7.

In writing to the word line WL7 (WLn), for example, 14V as the write voltage VPGM is applied to the selected word line WL7. For example, 8V as the voltage VPASS3 is applied to the dummy word lines WLDL (WLn+1) and WLDU (WLn+2), and for example, 6V as the voltage VPASS4 is applied to the non-selected word line WL6 (WLn−1). For example, 4V as the voltage VPASS1 is applied to the non-selected word line WL5 (WLn−2), and for example, 5V as the voltage VPASS2 is applied to the non-selected word lines WL8 (WLn+3) to WL11 (WLn+6).

In the second embodiment, the dummy word lines WLDL and WLDU are provided between the word lines WL7 and WL8. As described above, when the dummy word line is provided between the word lines WLs, the dummy word line is not set as the write target word line WLn. On the other hand, the voltage VPASS3 or the voltage VPASS4 may be applied to the word lines WLn+1 and WLn+2 or the word line WLn−1, each of which is adjacent to the write target word line WLn.

In the example illustrated in FIG. 29, the dummy word lines WLDL and WLDU are not set as the write target word line WLn, that is, the selected word line WLn. On the other hand, the dummy word lines WLDL and WLDU are set as the word lines WLn+1 and WLn+2 adjacent to the selected word line WLn, and the voltage VPASS3 (for example, 8V) is applied to the word lines WLn+1 and WLn+2.

Figure 30:
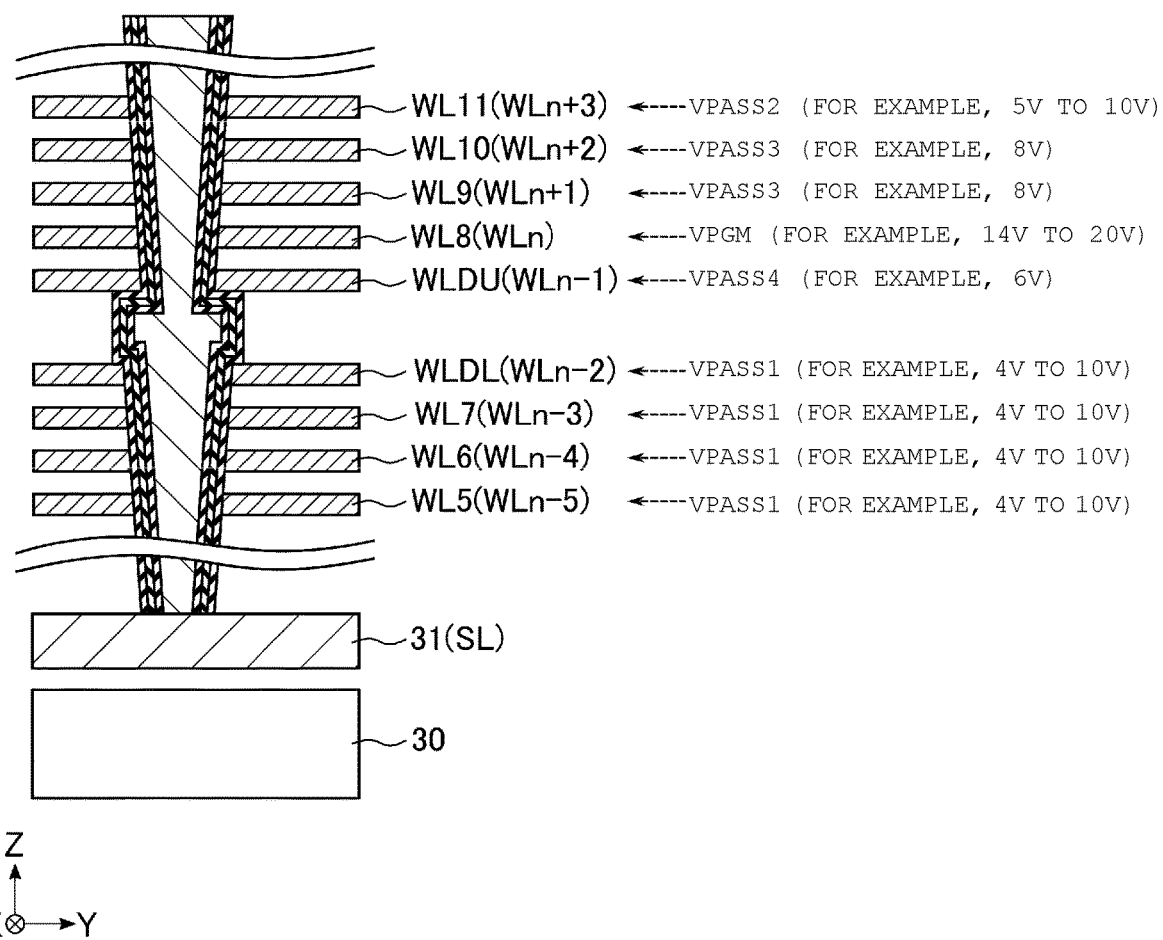
FIG. 30 is a diagram illustrating sections of the word lines and voltages applied to the word lines in the write operation according to the second embodiment.

FIG. 30 is a diagram illustrating voltages applied to the word lines WL5 to WL11 in writing to the word line WL8 (WLn). Similar to FIG. 29, FIG. 30 also illustrates a case where the data corresponding to the A state is written in the memory cell transistor MT connected to the word line WL8.

In writing to the word line WL8 (WLn), for example, 14V as the write voltage VPGM is applied to the selected word line WL8. For example, 8V as the voltage VPASS3 is applied to the word lines WL9 (WLn+1) and WL10 (WLn+2), and for example, 6V as the voltage VPASS4 is applied to the dummy word line WLDU (WLn−1). For example, 4V as the voltage VPASS1 is applied to the dummy word line WLDL (WLn−2) and the non-selected word lines WL7 (WLn−3) to WL5 (WLn−5), and for example, 5V as the voltage VPASS2 is applied to the non-selected word line WL11 (WLn+3).

In the example illustrated in FIG. 30, the dummy word lines WLDL and WLDU are not set as the write target word line WLn, that is, the selected word line WLn. On the other hand, the dummy word line WLDU is set as the word line WLn−1 adjacent to the selected word line WLn, and the voltage VPASS4 (for example, 6V) is applied to the word line WLn−1.

2.2 Effects According to Second Embodiment

According to the second embodiment, as in the first embodiment and the modification examples, it is possible to provide a semiconductor memory device capable of improving reliability of the write operation.

Further, the write operation proposed in this specification may be applied even when a dummy word line is provided between a plurality of stacked bodies in which the word lines WLs are stacked.

3. Other Modification Examples

In the semiconductor memory device according to the embodiments, the memory cell transistor MT0 is provided near the select transistor ST2 and the memory cell transistor MT7 is provided near the select transistor ST1, but the order of the memory cell transistors is not limited to the configuration. The order of the memory cell transistors may be upside down. For example, the memory cell transistor MT0 may be provided near the select transistor ST1 and the memory sell transistor MT7 may be provided near the select transistor st2.

In the embodiments, although the NAND flash memory is described as an example of the semiconductor memory device, the present disclosure is not limited to the NAND flash memory. For example, the present disclosure can be generally applied to other semiconductor memory devices, and can be applied to various memory devices other than the semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a source line;
a bit line;
a first word line between the source line and the bit line;
a second word line between the first word line and the bit line;
a third word line between the second word line and the bit line;
a fourth word line between the third word line and the bit line
a pillar penetrating through the first, second, third, and fourth word lines along a first direction and electrically connected to the source line and the bit line; and
a driver circuit configured to apply voltages to the first, second, third, and fourth word lines, wherein
the first, second, third, and fourth word lines are stacked via interlayer insulating films,
a first memory cell is formed at an intersection of the first word line and the pillar,
a second memory cell is formed at an intersection of the second word line and the pillar,
a third memory cell is formed at an intersection of the third word line and the pillar,
a fourth memory cell is formed at an intersection of the fourth word line and the pillar,
the first, second, third, and fourth memory cells are electrically connected in series, and
the driver circuit is configured to, in a first write operation for writing data to the second memory cell,
apply a first write voltage to the second word line,
apply a first voltage lower than the first write voltage to the first word line, and
apply a second voltage higher than the first voltage and lower than the first write voltage to the third and fourth word lines.

2. The semiconductor memory device according to claim 1, further comprising:
a fifth word line between the fourth word line and the bit line, wherein
the pillar penetrates through the fifth word line along the first direction,
the first, second, third, fourth, and fifth word lines are stacked via the interlayer insulating films,
a fifth memory cell is formed at an intersection of the fifth word line and the pillar,
the fourth and fifth memory cells are electrically connected in series, and
the driver circuit is further configured to, in the first write operation, apply a third voltage lower than the first write voltage to the fifth word line.

3. The semiconductor memory device according to claim 2, wherein the third voltage is equal to the second voltage.

4. The semiconductor memory device according to claim 2, further comprising:
a sixth word line between the source line and the first word line, wherein
the pillar penetrates through the sixth word line along the first direction,
the first, second, third, fourth, fifth, and sixth word lines are stacked via the interlayer insulating films,
a sixth memory cell is formed at an intersection of the sixth word line and the pillar,
the sixth and first memory cells are electrically connected in series,
the driver circuit is further configured to, in the first write operation, apply a fourth voltage lower than the first voltage to the sixth word line, and
the third voltage is between the fourth voltage and the first voltage.

5. The semiconductor memory device according to claim 1, further comprising:
a semiconductor substrate above which the first, second, third, and fourth word lines are stacked.

6. The semiconductor memory device according to claim 1, wherein
after the first write operation, a state of the second memory cell transitions from an erased state to a first state where a memory cell is read by a predetermined read voltage.

7. The semiconductor memory device according to claim 1, further comprising:
a fifth word line between the fourth word line and the bit line, wherein
the pillar penetrates through the fifth word line along the first direction,
the first, second, third, fourth, and fifth word lines are stacked via the interlayer insulating films,
a fifth memory cell is formed at an intersection of the fifth word line and the pillar,
the fourth and fifth memory cells are electrically connected in series,
the driver circuit is further configured to, in a second write operation for writing data to the second memory cell:
apply a second write voltage to the second word line,
apply a fifth voltage lower than the second write voltage to the first word line,
apply a sixth voltage higher than the fifth voltage and lower than the second write voltage to the third and fourth word lines, and
apply a seventh voltage equal to the fifth voltage to the fifth word line.

8. The semiconductor memory device according to claim 7, further comprising:
a sixth word line between the source line and the first word line, wherein
the pillar penetrates through the sixth word line along the first direction, the sixth, first, second, third, fourth, and fifth word lines are stacked via the interlayer insulating films, a sixth memory cell is formed at an intersection of the sixth word line and the pillar, the sixth and first memory cells are electrically connected in series, and the driver circuit is further configured to, in the second write operation, apply an eighth voltage lower than the fifth and seventh voltages to the sixth word line.

9. The semiconductor memory device according to claim 1, further comprising:

a fifth word line between the fourth word line and the bit line; and a sixth word line between the source line and the first word line, wherein the pillar penetrates through the fifth and sixth word lines along the first direction, the sixth, first, second, third, fourth, and fifth word lines are stacked via the interlayer insulating films, a fifth memory cell is formed at an intersection of the fifth word line and the pillar, a sixth memory cell is formed at an intersection of the sixth word line and the pillar, the fourth and fifth memory cells are electrically connected in series, the sixth and first memory cells are electrically connected in series, the driver circuit is further configured to, in a third write operation for writing data to the second memory cell:

apply a third write voltage to the second word line, apply a fifth voltage lower than the third write voltage to the first word line, apply a sixth voltage higher than the fifth voltage and lower than the third write voltage to the third and fourth word lines, apply a seventh voltage lower than the sixth voltage and higher than the fifth voltage to the fifth word line, and apply an eighth voltage equal to the fifth voltage to the sixth word line.

10. The semiconductor memory device according to claim 1, further comprising:

a fifth word line between the fourth word line and the bit line, wherein the pillar penetrates through the fifth word line along the first direction, the first, second, third, fourth, and fifth word lines are stacked via the interlayer insulating films, a fifth memory cell is formed at an intersection of the fifth word line and the pillar, the fourth and fifth memory cells are electrically connected in series, and the driver circuit is further configured to, in a fourth write operation for writing data to the second memory cell:

apply a fourth write voltage to the second word line, apply a fifth voltage lower than the fourth write voltage to the first word line, apply a sixth voltage higher than the fifth voltage and lower than the fourth write voltage to the third and fourth word lines, and apply a seventh voltage equal to the sixth voltage to the fifth word line.

11. The semiconductor memory device according to claim 10, further comprising:

a sixth word line between the source line and the first word line, wherein the pillar penetrates through the sixth word line along the first direction, the sixth, first, second, third, fourth, and fifth word lines are stacked via the interlayer insulating films, a sixth memory cell is formed at an intersection of the sixth word line and the pillar, the sixth and first memory cells are electrically connected in series, and the driver circuit is further configured to, in the fourth write operation, apply an eighth voltage higher than the fifth voltage and lower than the sixth and seventh voltages and to the sixth word line.

12. The semiconductor memory device according to claim 1, further comprising:

a fifth word line between the fourth word line and the bit line, wherein the pillar penetrates through the fifth word line along the first direction, the first, second, third, fourth, and fifth word lines are stacked via the interlayer insulating films, a fifth memory cell is formed at an intersection of the fifth word line and the pillar, the fourth and fifth memory cells are electrically connected in series, and the driver circuit is further configured to, in a fifth write operation for writing data to the second memory cell:

apply a fifth write voltage to the second word line, apply a fifth voltage lower than the fifth write voltage to the first word line, apply a sixth voltage higher than the fifth voltage and lower than the fifth write voltage to the third and fourth word lines, and apply a seventh voltage higher than the sixth voltage to the fifth word line.

13. The semiconductor memory device according to claim 12, further comprising:

a sixth word line between the source line and the first word line, wherein the pillar penetrates through the sixth word line along the first direction, the sixth, first, second, third, fourth, and fifth word lines are stacked via the interlayer insulating films, a sixth memory cell is formed at an intersection of the sixth word line and the pillar, the sixth and first memory cells are electrically connected in series, and the driver circuit is further configured to, in the fifth write operation, apply an eighth voltage equal to the sixth voltage to the sixth word line.

14. The semiconductor memory device according to claim 1, further comprising:

a fifth word line between the fourth word line and the bit line; and a sixth word line between the source line and the first word line, wherein the pillar penetrates through the fifth and sixth word lines along the first direction, the sixth, first, second, third, fourth, and fifth word lines are stacked via the interlayer insulating films, a fifth memory cell is formed at an intersection of the fifth word line and the pillar, a sixth memory cell is formed at an intersection of the sixth word line and the pillar, the fourth and fifth memory cells are electrically connected in series, the sixth and first memory cells are electrically connected in series, and the driver circuit is further configured to, in a sixth write operation for writing data to the second memory cell:
apply a sixth write voltage to the second word line,
apply a fifth voltage lower than the sixth write voltage to the first word line,
apply a sixth voltage higher than the fifth voltage and lower than the sixth write voltage to the third and fourth word lines,
apply a seventh voltage higher than the sixth voltage and lower than the sixth write voltage to the fifth word line, and
apply an eighth voltage higher than the sixth voltage and lower than the seventh voltage to the sixth word line.

15. The semiconductor memory device according to claim 1, further comprising:
a fifth word line between the source line and the first word line, wherein
the pillar penetrates through the fifth word line in the first direction,
the fifth, first, second, third, and fourth word lines are stacked via the interlayer insulating films,
a fifth memory cell is formed at an intersection of the fifth word line and the pillar,
the fifth and first memory cells are electrically connected in series, and
the driver circuit is further configured to, in a second write operation for writing data in the first memory cell, the second write operation being performed before the first write operation is performed:
apply a second write voltage to the first word line, and
apply a fifth voltage higher than the second voltage to the fifth word line and the second word line.

16. The semiconductor memory device according to claim 15, further comprising:
a sixth word line between the fourth word line and the bit line;
a seventh word line between the sixth word line and the bit line; and
an eighth word line between the seventh word line and the bit line, wherein
the pillar penetrates through the sixth, seventh, and eighth word lines along the first direction,
the fifth, first, second, third, fourth, sixth, seventh, and eighth word lines are stacked via the interlayer insulating films,
a sixth memory cell is formed at an intersection of the sixth word line and the pillar,
a seventh memory cell is formed at an intersection of the seventh word line and the pillar,
an eighth memory cell is formed at an intersection of the eighth word line and the pillar,
the fourth and sixth memory cells are electrically connected in series,
the sixth and seventh memory cells are electrically connected in series,
the seventh and eighth memory cells are electrically connected in series, and
the driver circuit is further configured to, in a third write operation for writing data in the seventh memory cell, the third write operation being performed after the first write operation has been performed:
apply a third write voltage to the seventh word line, and
apply the fifth voltage lower than the third write voltage to the sixth and eighth word lines.

17. The semiconductor memory device according to claim 1, further comprising:
a row decoder electrically connected to the driver circuit and the first, second, third, and fourth word lines, wherein
the first write voltage, the first voltage, and the second voltage are applied to the second word line, the first word line, and the third and fourth word lines via the row decoder, respectively.

18. The semiconductor memory device according to claim 17, further comprising:
a memory cell array including the first, second, third, and fourth memory cells; and
a sense amplifier electrically connected to the bit line and arranged on one side of the memory cell array that is different from one side of the memory cell array where the row decoder is arranged.

19. A semiconductor memory device comprising:
a source line;
a bit line;
a first word line between the source line and the bit line;
a second word line between the first word line and the source line;
a third word line between the second word line and the source line;
a fourth word line between the third word line and the source line;
a pillar penetrating through the first, second, third, and fourth word lines along a first direction and electrically connected to the source line and the bit line; and
a driver circuit configured to apply voltages to the first, second, third, and fourth word lines, wherein
the first, second, third, and fourth word lines are stacked via interlayer insulating films,
a first memory cell is formed at an intersection of the first word line and the pillar,
a second memory cell is formed at an intersection of the second word line and the pillar,
a third memory cell is formed at an intersection of the third word line and the pillar,
a fourth memory cell is formed at an intersection of the fourth word line and the pillar,
the first, second, third, and fourth memory cells are electrically connected in series, and
the driver circuit is configured to, in a first write operation for writing data to the second memory cell:
apply a first write voltage to the second word line,
apply a first voltage lower than the first write voltage to the first word line, and
apply a second voltage higher than the first voltage and lower than the first write voltage to the third and fourth word lines.

* * * * *